United States Patent [19]

Higashino et al.

[11] Patent Number: 5,723,253
[45] Date of Patent: Mar. 3, 1998

[54] LIGHT-SENSITIVE COMPOSITION AND LIGHT-SENSITIVE LITHOGRAPHIC PRINTING PLATE CONTAINING O-QUINONEDIAZIDE COMPOUND, NOVOLAK RESIN, POLYMER AND ENCLOSURE COMPOUND

[75] Inventors: Katuhiko Higashino; Tomohisa Ohta; Shinichi Matsubara, all of Tokyo, Japan

[73] Assignees: Konica Corporation; Mitsubishi Chemical Corporation, both of Tokyo, Japan

[21] Appl. No.: 567,101

[22] Filed: Dec. 4, 1995

[30] Foreign Application Priority Data

Dec. 5, 1994 [JP] Japan .................. 6-329987
Jun. 23, 1995 [JP] Japan .................. 7-179585

[51] Int. Cl.$^6$ .................................................. G03F 7/023
[52] U.S. Cl. ..................... 430/166; 430/165; 430/191; 430/192
[58] Field of Search ........................... 430/165, 166, 430/191, 192

[56] References Cited

U.S. PATENT DOCUMENTS

| | | |
|---|---|---|
| 3,181,461 | 5/1965 | Fromson . |
| 3,511,661 | 5/1970 | Rauner et al. . |
| 4,910,119 | 3/1990 | Schneller et al. ............ 430/192 |
| 5,275,908 | 1/1994 | Elsaesser et al. ............ 430/192 |
| 5,332,650 | 7/1994 | Murata et al. ............... 430/192 |

FOREIGN PATENT DOCUMENTS

| | | |
|---|---|---|
| 0353873A1 | 2/1990 | European Pat. Off. . |
| 0397375A1 | 11/1990 | European Pat. Off. . |
| 0544264A1 | 6/1993 | European Pat. Off. . |
| 0549339A1 | 6/1993 | European Pat. Off. . |
| 0633500A1 | 1/1995 | European Pat. Off. . |
| 0639797A1 | 2/1995 | European Pat. Off. . |

*Primary Examiner*—Christopher G. Young
*Attorney, Agent, or Firm*—Finnegan, Henderson, Farabow, Garrett & Dunner, L.L.P.

[57] ABSTRACT

Disclosed is a light-sensitive composition containing an o-quinonediazide compound, a novolak resin and a polymer, characterized in that the polymer contains a constitutional unit selected from the group consisting of constitutional units represented by the formulae (I), (II) and (III):

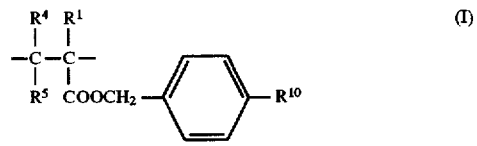

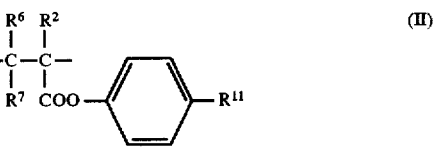

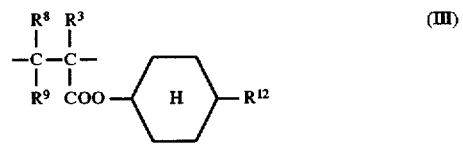

wherein $R^1$ to $R^{12}$ each represent a hydrogen atom, an alkyl group or a phenyl group,
and a lithographic printing plate using the same.

15 Claims, No Drawings

LIGHT-SENSITIVE COMPOSITION AND LIGHT-SENSITIVE LITHOGRAPHIC PRINTING PLATE CONTAINING O-QUINONEDIAZIDE COMPOUND, NOVOLAK RESIN, POLYMER AND ENCLOSURE COMPOUND

BACKGROUND OF THE INVENTION

This invention relates to a light-sensitive composition and a light-sensitive lithographic printing plate using the same, more specifically to a light-sensitive composition which does not have problems such as lowering of sensitivity and deterioration of developability and has excellent press life, and a light-sensitive lithographic printing plate using the same.

A light-sensitive lithographic printing plate comprises a light-sensitive layer provided on a hydrophilic support. For example, in a positive type light-sensitive lithographic printing plate, an ink-receivable light-sensitive layer which is made soluble by exposure of active light such as UV ray is formed on a hydrophilic support.

In such a positive type light-sensitive lithographic printing plate, when the light-sensitive layer is subjected to image exposure and then the plate is developed, a portion exposed to light of the light-sensitive layer which is ink-receivable is removed to expose the surface of the hydrophilic support, while the ink-receivable light-sensitive layer which is not subjected to exposure to light remains on the support to form an ink-receivable layer. In lithographic printing, there is utilized such a difference in properties that the portion exposed to light is hydrophilic and the portion which is not exposed to light is lipophilic.

An o-quinonediazide compound generates carboxylic acid by irradiation of active light and becomes soluble in an aqueous alkaline developing solution so that by using such a property, the o-quinonediazide compound is used as a light-sensitive material of a positive type light-sensitive lithographic printing plate.

In general, in a positive type light-sensitive lithographic printing plate using an o-quinonediazide compound, a light-sensitive layer containing the o-quinonediazide compound is formed on an aluminum support subjected to roughening and anodization.

It is required that such a light-sensitive lithographic printing plate has high press life, high sensitivity and high developability and the surface of a support has high hydrophilic property.

As a technique of improving press life, there have generally been known:

(1) a technique of heightening a molecular weight of a binder in a light-sensitive composition;

(2) a technique of heightening a molecular weight of a light-sensitive compound and others. However, when press life is improved by the above techniques, there are problems such as lowering in sensitivity and deterioration of developability.

As a technique of improving sensitivity and developability, there have generally been known:

(1) a technique of lowering a molecular weight of a binder in a light-sensitive composition;

(2) a technique of lowering a molecular weight of a light-sensitive compound;

(3) a technique of adding an organic acid or an acid anhydride to a light-sensitive composition and others. However, when sensitivity and developability are improved by the above techniques, there are problems such as lowering in press life.

As a technique of imparting hydrophilic property to the surface of a support, there have generally been known:

(1) a technique of providing a hydrophilic layer comprising a water-soluble polymer on a support and others. However, when hydrophilic property is improved by the above techniques, there are problems such as lowering in press life. That is, it is an extremely difficult technique to satisfy all of press life, high sensitivity, high developability and hydrophilic property simultaneously.

SUMMARY OF THE INVENTION

An object of the present invention is to provide a light-sensitive composition which can satisfy all of press life, high sensitivity, high developability and hydrophilic property, and a light-sensitive lithographic printing plate using the same.

The above object of the present invention can be accomplished by (1) a light-sensitive composition containing an o-quinonediazide compound, a novolak resin and a polymer, characterized in that the polymer contains a constitutional unit selected from the group consisting of constitutional units represented by the formulae (I), (II) and (III):

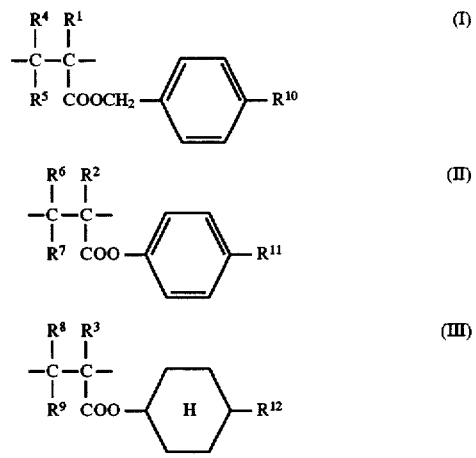

wherein $R^1$ to $R^{12}$ each represent a hydrogen atom, an alkyl group or a phenyl group, (2) the composition of the above (1) wherein $R^1$ is a hydrogen atom or a lower alkyl group having 1 to 4 carbon atoms; each of $R^4$ and $R^5$ is a hydrogen atom, a lower alkyl group having 1 to 6 carbon atoms or a phenyl group; $R^{10}$ is a hydrogen atom, a lower alkyl group having 1 to 6 carbon atoms or a phenyl group; $R^2$ is a hydrogen atom or a lower alkyl group having 1 to 4 carbon atoms; each of $R^6$ and $R^7$ is a hydrogen atom, a lower alkyl group having 1 to 6 carbon atoms or a phenyl group; $R^{11}$ is a hydrogen atom, a lower alkyl group having 1 to 6 carbon atoms or a phenyl group; $R^3$ is a hydrogen atom or a lower alkyl group having 1 to 4 carbon atoms; each of $R^8$ and $R^9$ is a hydrogen atom, a lower alkyl group having 1 to 6 carbon atoms or a phenyl group; and $R^{12}$ is a hydrogen atom, a lower alkyl group having 1 to 6 carbon atoms or a phenyl group, (3) the composition of the above (1) wherein $R^1$ is a hydrogen atom or a methyl group; each of $R^4$ and $R^5$ is a hydrogen atom; $R^{10}$ is a hydrogen atom; $R^2$ is a hydrogen atom or a methyl group, each of $R^6$ and $R^7$ is a hydrogen atom; $R^{11}$ is a hydrogen atom; $R^3$ is a hydrogen atom or a methyl group; each of $R^8$ and $R^9$ is a hydrogen atom; and $R^{12}$ is a hydrogen atom.

(4) the composition of the above (1) wherein the polymer contains 3 to 40 mole % of a constitutional unit selected from the group consisting of the constitutional units represented by the formulae (I), (II) and (III).

(5) the composition of the above (4) wherein the polymer contains 5 to 20 mole % of at least one constitutional unit selected from the group consisting of the constitutional units represented by the formulae (I), (II) and (III), (6) the composition of the above (1) wherein the polymer contains a constitutional unit selected from the group consisting of (a) acrylates and methacrylates, (b) acrylic acid, methacrylic acid, maleic anhydride and itaconic acid, (c) acrylonitrile and methacrylonitrile, (d) vinyl monomers having an aromatic hydroxyl group, (e) acrylamides and methacrylamides, (f) styrene and substituted styrenes, (g) N-vinylpyrrolidone and N-vinylcarbazole, (h) vinylpyridine and (i) olefins, (7) the composition of the above (6) wherein the polymer contains 20 to 70 mole % of a constitutional unit selected from (a) acrylates and methacrylates, 0 to 30 mole % of a constitutional unit selected from (b) acrylic acid, methacrylic acid, maleic anhydride and itaconic acid, 10 to 40 mole % of a constitutional unit selected from (c) acrylonitrile and methacrylonitrile, and 5 to 50 mole % of a constitutional unit selected from (d) vinyl monomers having an aromatic hydroxyl group, (8) the composition of the above (1) wherein the novolak resin is a phenol.cresol.formaldehyde copolymer, (9) the composition of the above (1) wherein the o-quinonediazide compound is a polycondensed resin having an o-quinonediazide group of pyrogallol and an aldehyde or a ketone,

(10) the composition of the above (1) wherein said composition further comprises an enclosure compound which acts as a host compound capable of taking a chemical species therein as a guest compound,

(11) the composition of the above (10) wherein the enclosure compound is cyclodextrin or a cyclodextrin derivative,

(12) the composition of the above (1) wherein said composition further comprises a halomethyl-s-triazine compound,

(13) a light-sensitive layer coating solution which comprises the composition of the above (1) dissolved in a solvent containing at least one selected from the group consisting of propylene glycol monomethyl ether, methyl ethyl ketone, methyl lactate and diethylene glycol diethyl ether,

(14) a light-sensitive lithographic printing plate which comprises a support and a light-sensitive layer comprising the composition of the above (1), provided on the support.

(15) the plate of the above (14) wherein the support is a support obtained by subjecting a support to graining treatment and anodization treatment and then providing a hydrophilic layer comprising a compound having an organic phosphonic acid group on the support,.

(16) the plate of the above (14) wherein the light-sensitive layer is a light-sensitive layer formed by coating and drying the solution of the above (11), and

(17) the plate of the above (14) wherein the light-sensitive layer is formed by coating the solution of the above (11) on a support obtained by subjecting a support to graining treatment and anodization treatment and then providing a hydrophilic layer comprising a compound having an organic phosphonic acid group on the support; and then drying the solution.

DESCRIPTION OF THE PREFERRED EMBODIMENTS

In the following, the present invention is explained in detail.

The o-quinonediazide compound to be used in the light-sensitive composition of the present invention is a compound having an o-quinonediazide group in a molecule. The o-quinonediazide compound which can be used in the present invention is not particularly limited and may include, for example, an ester compound of a polycondensed resin having an o-quinonediazide group, for example, a polycondensed resin of o-naphthoquinonediazidesulfonic acid, a phenol and an aldehyde or a ketone.

As the phenol in the above polycondensed resin of a phenol and an aldehyde or a ketone, there may be mentioned, for example, a monovalent phenol such as phenol, o-cresol, m-cresol, p-cresol, 3,5-xylenol, carvacrol and thymol, a divalent phenol such as catechol, resorcin and hydroquinone and a trivalent phenol such as pyrogallol and phloroglucin. As the aldehyde, there may be mentioned, for example, formaldehyde, benzaldehyde, acetaldehyde, crotonaldehyde and furfural. Among them, formaldehyde and benzaldehyde are preferred. As the ketone, there may be mentioned, for example, acetone and methyl ethyl ketone.

As a specific example of the polycondensed resin of a phenol and an aldehyde or a ketone, there may be mentioned a phenol formaldehyde resin, a m.cresol.formaldehyde resin, a m- and p-mixed cresol.formaldehyde resin, a recorsin.benzaldehyde resin and a pyrogallol acetone resin. Among them, a particularly preferred resin is a pyrogallol acetone resin.

In the above o-naphthoquinonediazide compound, the condensation ratio of o-naphthoquinonediazidesulfonic acid based on an OH group of the phenol (reactivity based on one OH group) is preferably 15% tog 80%, more preferably 20% to 45%.

Further, as the o-quinonediazide compound to be used in the present invention, there may be mentioned the following compounds described in Japanese Provisional Patent Publication No. 43451/1983, i.e., known 1,2-quinonediazide compounds such as 1,2-benzoquinonediazidesulfonate, 1,2-naphthoquinonediazidesulfonate, 1,2-benzoquinonediazidesulfonic acid amide and 1,2-naphthoquinonediazidesulfonic acid amide. As a further specific example thereof, there may be mentioned 1,2-quinonediazide compounds such as phenyl 1,2-benzoquinonediazide-4-sulfonate, 1,2,1',2'-di-(benzoquinonediazide-4-sulfonyl)dihydroxybiphenyl, 1,2-benzoquinonediazide-4-(N-ethyl-N-β-naphthyl)sulfonamide, cyclohexyl 1,2-naphthoquinonediazide-5-sulfonate, 1-(1,2-naphthoquinonediazide- 5-sulfonyl)-3,5-dimethylpyrazole, 1,2-naphthoquinonediazide-5-sulfonic acid-4'-hydroxydiphenyl-4'-azo-β-naphthol ester, N,N-di-(1,2-naphthoquinonediazide-5-sulfonyl)aniline, 2'-(1,2-naphthoquinonediazide-5-sulfonyloxy)-1-hydroxyanthraquinone, 1,2-naphthoquinonediazide-5-sulfonic acid-2,4-dihydroxybenzophenone ester, 1,2-naphthoquinonediazide-5-sulfonic acid-2,3,4-trihydroxybenzophenone ester, a condensate of 2 mole of 1,2-naphthoquinonediazide-5-sulfonic acid chloride and 1 mole of 4,4'-diaminobenzophenone, a condensate of 2 mole of 1,2-naphthoquinonediazide-5-sulfonic acid chloride and 1 mole of 4,4'-dihydroxy-1,1-diphenylsulfonic acid, a condensate of 1 mole of 1,2-naphthoquinonediazide-5-sulfonic acid chloride and 1 mole of purpurogallin, and 1,2-naphthoquinonediazide-5-(N-dihydroabietyl)sulfonamide described in J. Kosar, "Light-Sensitive Systems", pp. 339 to 352 (1965), John Willey & Sons Co. (N.Y.) and W. S. De Forest, "Photoresist", Vol. 50 (1975), McGraw Hill Co. (N.Y.). Also, there may be mentioned 1,2-quinonediazide compounds described in Japanese Patent Publications No. 1953/1962, No. 3627/1962, No. 13109/1962, No. 26126/1965, No. 3801/1965, No. 5604/1970, No. 27345/1970 and No. 13013/1976, and Japanese Provisional Patent Publications No. 96575/1973, No. 63802/1973 and No. 63803/1973.

Among the above o-quinonediazide compounds, particularly preferred is an o-quinonediazide ester compound obtained by reacting 1,2-benzoquinonediazidesulfonyl chloride or 1,2-naphthoquinonediazidesulfonyl chloride with a pyrogallol, acetone condensed resin or 2,3,4-trihydroxybenzophenone.

In the present invention, as the o-quinonediazide compound, the above compounds may be used singly or in combination of two or more, respectively.

The ratio of the o-quinonediazide compound in the light-sensitive composition is preferably 5 to 60% by weight, particularly preferably 10 to 50% by weight.

In the following, the polymer having at least one constitutional unit selected from the group consisting of constitutional units represented by the following formulae (I), (II) and (III) (hereinafter referred to as "the polymer of the present invention") is described.

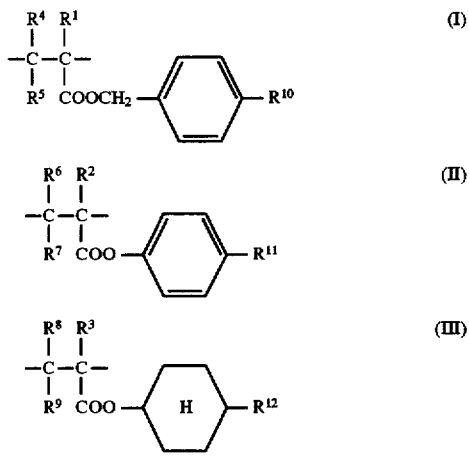

wherein $R^1$ to $R^{12}$ each represent a hydrogen atom, an alkyl group or a phenyl group The polymer of the present invention may be any polymer so long as it is a polymer having at least one constitutional unit selected from constitutional units represented by the formulae (I), (II) and (III).

In the constitutional unit represented by the formula (I), $R^1$ is preferably a hydrogen atom or a lower alkyl group having 1 to 4 carbon atoms, particularly preferably a hydrogen atom or a methyl group. As $R^4$ and $R^5$, there may be mentioned a hydrogen atom, a lower alkyl group having 1 to 6 carbon atoms or a phenyl group, preferably a hydrogen atom. As $R^{10}$, there may be mentioned a hydrogen atom, a lower alkyl group having 1 to 6 carbon atoms or a phenyl group, particularly preferably a hydrogen atom.

In the constitutional unit represented by the formula (II), $R^2$ is preferably a hydrogen atom or a lower alkyl group having 1 to 4 carbon atoms, particularly preferably a hydrogen atom or a methyl group. As $R^6$ and $R^7$, there may be mentioned a hydrogen atom, a lower alkyl group having 1 to 6 carbon atoms or a phenyl group, preferably a hydrogen atom. As $R^{11}$, there may be mentioned a hydrogen atom, a lower alkyl group having 1 to 6 carbon atoms or a phenyl group, particularly preferably a hydrogen atom.

In the constitutional unit represented by the formula (III), $R^3$ is preferably a hydrogen atom or a lower alkyl group having 1 to 4 carbon atoms, particularly preferably a hydrogen atom or a methyl group. As $R^8$ and $R^9$, there may be mentioned a hydrogen atom, a lower alkyl group having 1 to 6 carbon atoms or a phenyl group, preferably a hydrogen atom. As $R^{12}$, there may be mentioned a hydrogen atom, a lower alkyl group having 1 to 6 carbon atoms or a phenyl group, particularly preferably a hydrogen atom.

As a monomer introducing the constitutional unit represented by the formula (I) into the polymer, there may be mentioned, for example, benzyl methacrylate and benzyl acrylate; as a monomer introducing the constitutional unit represented by the formula (II) into the polymer, there may be mentioned, for example, phenyl methacrylate and phenyl acrylate; and as a monomer introducing the constitutional unit represented by the formula (III) into the polymer, there may be mentioned, for example, cyclohexyl methacrylate and cyclohexyl acrylate.

In the polymer of the present invention, the constitutional units represented by the formulae (I), (II) and (III) are contained preferably in an amount of 3 to 40 mole %, more preferably 5 to 20 mole % based on the total monomer units.

The polymer of the present invention can be obtained by copolymerizing the above monomer and other vinyl type monomer.

As an example of the above other vinyl type monomer, there may be mentioned:

(a) acrylates and methacrylates which may have an aliphatic hydroxyl group such as 2-hydroxyethyl acrylate, 2-hydroxyethyl methacrylate, methyl acrylate, ethyl acrylate, propyl acrylate, butyl acrylate, amyl acrylate, hexyl acrylate, octyl acrylate, 2-chloroethyl acrylate, glycidyl acrylate, N-dimethylaminoethyl acrylate, methyl methacrylate, ethyl methacrylate, propyl methacrylate, butyl methacrylate, amyl methacrylate, 4-hydroxybutyl methacrylate, glycidyl methacrylate and N-dimethylaminoethyl methacrylate;

(b) acrylic acid, methacrylic acid, maleic anhydride and itaconic acid;

(c) acrylonitrile and methacrylonitrile;

(d) vinyl monomers having an aromatic hydroxyl group such as o-, m- or p-hyroxyphenyl (meth)acrylamide, o-, m- or p-hydroxystyrene, o-, m- or p-hydroxyphenyl (meth)acrylate and o-, m- or p-hydroxyphenylmaleimide;

(e) acrylamides and methacrylamides such as acrylamide, methacrylamide, N-methylolacrylamide, N-methylolmethacrylamide, N-ethylacrylamide, N-hexylmethacrylamide, N-cyclohexylacrylamide, N-hydroxyethylacrylamide, N-phenylacrylamide, N-nitrophenylacrylamide and N-ethyl-N-phenylacrylamide;

(f) styrenes and substituted styrenes such as styrene, α-methylstyrene, methylstyrene and chloromethylstyrene;

(g) N-vinylpyrrolidone and N-vinylcarbazole;

(h) vinylpyridine; and (i) olefins such as ethylene, propylene, isobutylene, butadiene, isoprene, ethyl vinyl ether, 2-chloroethyl vinyl ether, hydroxyethyl vinyl ether, propyl vinyl ether, butyl vinyl ether, octyl vinyl ether, phenyl vinyl ether, vinyl acetate, vinyl chloroacetate, vinyl butyrate, vinyl benzoate, methyl vinyl ketone, ethyl vinyl ketone, propyl vinyl ketone and phenyl vinyl ketone.

Among the above monomers, (a), (b), (c) and (d) are particularly preferred. With regard to the contents of the respective constitutional units in the polymer, it is preferred that the content of (a) is 20 to 70 mole %; that of (b) is 0 to 30 mole %; that of (c) is 10 to 40 mole %; and that of (d) is 5 to 50 mole %.

Further, in the polymer of the present invention, other monomer which can be copolymerized with the above monomer may be copolymerized.

As the polymer of the present invention, preferred is a polymer having a phenolic hydroxyl group in a molecule obtained by copolymerization using the vinyl monomer having an aromatic hydroxyl group described in the above (1), particularly a vinyl monomer having a phenolic hydroxyl group.

The weight average molecular weight of the polymer of the present invention is preferably 15,000 to 200,000, more preferably 20,000 to 130,000.

The polymer of the present invention is preferably alkali-soluble. Here, "alkali-soluble" means not only "soluble in an alkaline liquid" but also "having swellability in an alkaline liquid".

In the following, specific examples of the polymer of the present invention are shown.

High molecular weight compound 1

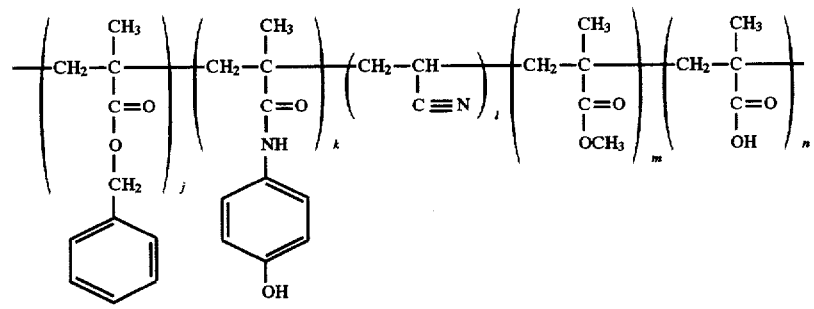

j/k/l/m/n = 5/30/20/36.5/8.5

High molecular weight compound 2

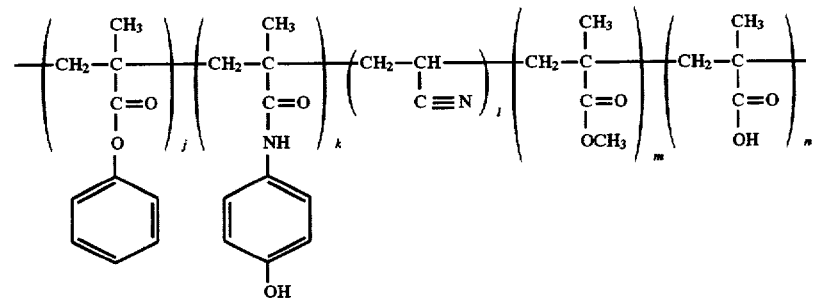

j/k/l/m/n = 5/30/20/36.5/8.5

High molecular weight compound 3

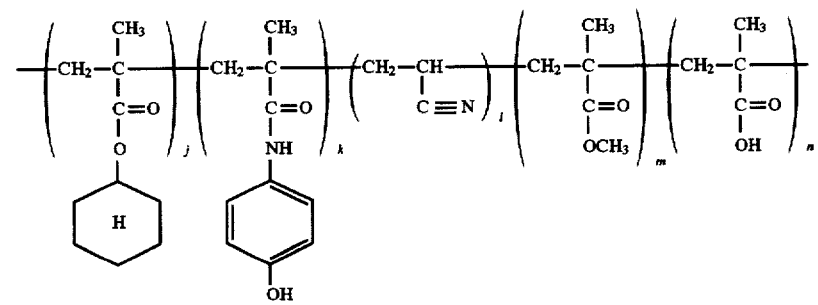

j/k/l/m/n = 5/30/20/36.5/8.5

High molecular weight compound 4

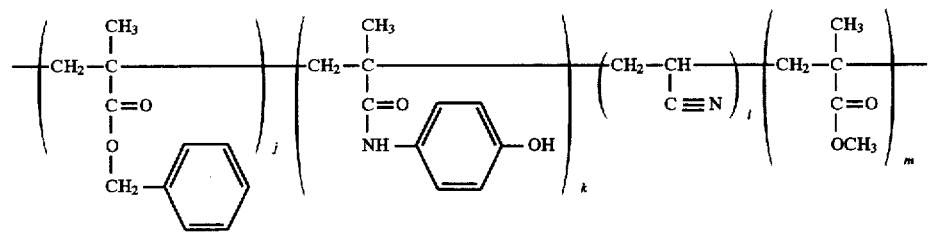

j/k/l/m/n = 10/33.5/20/36.5

In the polymer of the present invention, other polymer such as a urethane resin and a polyvinyl butyral resin may be blended.

To the light-sensitive composition of the present invention, 5 to 95% of other alkali-soluble high molecular weight compound may be added.

The alkali-soluble resin which can be used is not particularly limited, and a conventionally known alkali-soluble resin may be used. There may be mentioned, for example, a novolak resin, a vinyl type polymer having a phenolic hydroxyl group and a condensed resin of a polyvalent phenol and an aldehyde or a ketone described in Japanese Provisional Patent Publication No. 57841/1980.

As the novolak resin to be used in the present invention, there may be mentioned, for example, a phenol.formaldehyde resin, a cresol.formaldehyde resin, a phenol.cresol-.formaldehyde copolymer resin as described in Japanese Provisional Patent Publication No. 57841/1980 and a copolymer resin of p-substituted phenol and a phenol, or cresol and a formaldehyde as described in Japanese Provisional Patent Publication No. 127553/1980. Among them, a particularly preferred resin is a phenol.cresol.formaldehyde copolymer resin. In said resin, the content of the phenol in phenol.cresol is preferably 2 to 50 mole %, more preferably 5 to 50 mole %, and the cresol is preferably a mixed cresol of m-cresol and p-cresol at a molar ratio of m-cresol to p-cresol being 100/0 to 50/50.

As to the molecular weight (based on polystyrene) of the novolak resin, it is preferred that the number average molecular weight (Mn) is $3.00 \times 10^2$ to $7.50 \times 10^3$ and the weight average molecular weight (Mw) is $1.00 \times 10^3$ to $3.00 \times 10^4$. It is more preferred that Mn is $5.00 \times 10^2$ to $4.00 \times 10^3$ and Mw is $3.00 \times 10^3$ to $2.00 \times 10^4$.

The above novolak resins may be used singly or in combination of two or more.

In the light-sensitive composition of the present invention, the ratio of the o-quinonediazide compound, the novolak resin and the polymer having a constitutional unit selected from the group consisting of the constitutional units represented by the above formulae (I), (II) and (II) is preferably (5 to 50% by weight)/(5 to 85% by weight)/(5 to 85% by weight), more preferably (15 to 40% by weight)/(5 to 75% by weight)/(5 to 75% by weight).

Further, the vinyl type polymer having a phenolic hydroxyl group is a polymer having a unit having the phenolic hydroxyl group in a molecular structure, preferably a polymer having at least one of the constitutional units represented by the following formulae (IV) to (VIII).

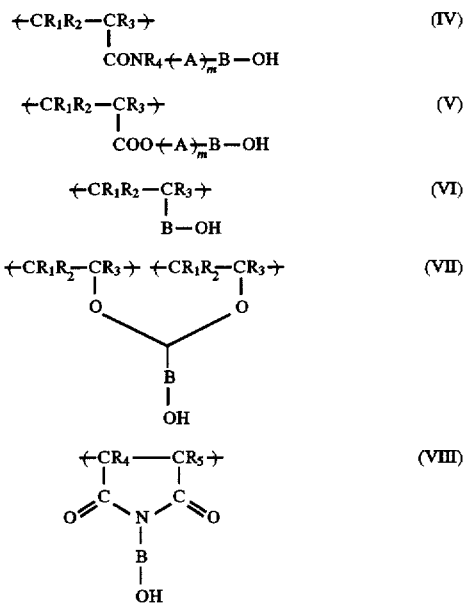

In the formulae (IV) to (VIII), $R_1$ and $R_2$ each represent a hydrogen atom, an alkyl group or a carboxyl group, preferably a hydrogen atom. $R_3$ represents a hydrogen atom, a halogen atom or an alkyl group, preferably a hydrogen atom or an alkyl group such as a methyl group and an ethyl group. $R_4$ and $R_5$ each represent a hydrogen atom, an alkyl group, an aryl group or an aralkyl group, preferably a hydrogen atom. A represents a substituted or unsubstituted alkylene group which links a nitrogen atom or an oxygen atom with an aromatic carbon atom. m represents an integer of 0 to 10. B represents a substituted or unsubstituted phenylene group or a substituted or unsubstituted naphthylene group.

The vinyl type polymer having the above phenolic hydroxyl group to be used in the present invention preferably has a copolymer type structure having the constitutional units represented by the above formulae (IV) to (VIII). As a monomer to be copolymerized, there may be mentioned ethylenic unsaturated olefins such as-ethylene, propylene, isobutylene, butadiene and isoprene; styrenes such as styrene, α-methylstyrene, p-methylstyrene and p-chlorostyrene; acrylic acids such as acrylic acid and methacrylic acid; unsaturated aliphatic dicarboxylic acids such as itaconic acid, maleic acid and maleic anhydride; esters of α-methylene aliphatic monocarboxylic acid such as methyl acrylate, ethyl acrylate, n-butyl acrylate, isobutyl acrylate, dodecyl acrylate, 2-chloroethyl acrylate, phenyl acrylate, methyl α-chloroacrylate, methyl methacrylate, ethyl methacrylate and ethyl ethacrylate; nitriles such as acrylonitrile and methacrylonitrile; amides such as acrylamide and methacrylamide; anilides such as acrylanilide, p-chloroacrylanilide, m-nitroacrylanilide and m-methoxyacrylanilide; vinyl esters such as vinyl acetate, vinyl propionate and vinyl benzoate; vinyl ethers such as methyl vinyl ether, ethyl vinyl ether, isobutyl vinyl ether and β-chloroethyl vinyl ether; vinyl chloride; vinylidene chloride; vinylidene cyanide; ethylene derivatives such as 1-methyl-1-methoxyethylene, 1,1-dimethoxyethylene, 1,2-dimethoxyethylene, 1,1-dimethoxycarbonylethylene and 3,1-methyl-1-nitroethylene; and N-vinyl type monomers such as N-vinylpyrrole, N-vinylcarbazole, N-vinylindole, N-vinylpyrrolidene and N-vinylpyrrolidone. These monomers exist in a high molecular weight compound in a structure of a cleaved double bond.

Among the above monomers, preferred are esters of aliphatic monocarboxylic acid and nitriles which show excellent characteristics to obtain the effect of the present invention.

These monomers may be bonded in the polymer to be used in the present invention in either of a block or random state.

As the vinyl type polymer having a phenolic hydroxyl group, the above polymers may be used singly or in combination of two or more.

To the light-sensitive composition of the present invention, a print-out material which forms a visible image by exposure to light may be added. The print-out material comprises a compound which forms an acid or a free group by exposure and an organic dye which changes its color tone by interaction with the acid or free group formed. As the compound which forms an acid or a free group by exposure, there may be mentioned, for example, o-naphthoquinonediazide-4-sulfonic acid halogenide and halomethyl-s-triazine compounds described in Japanese Provisional Patent Publication No. 36209/1975, trihalomethyl-2-pyrone and trihalomethyl-triazine described in Japanese Provisional Patent Publication No. 36223/1988, an ester compound or an amide compound comprising o-naphthoquinonediazide-4-sulfonic acid chloride and a phenol having an electron-attracting substituent or aniline described in Japanese Provisional Patent Publication No. 6244/1980, and a halomethylvinyloxadiazole compound and a diazonium salt described in Japanese Provisional Patent Publications No. 77742/1980 and No. 148784/1982. Particularly preferred is a halomethyl-s-triazine compound.

The above triazine compound can be obtained by condensing 2,4-bis(halomethyl)-6-(substituted) alkyl-s-triazine or 2,4-bis(halomethyl)-6-(substituted) aryl-s-triazine with a corresponding aromatic (heterocyclic) aldehyde according to a known method described in Japanese Provisional Patent Publication No. 36209/1975.

As a preferred aldehyde, there may be mentioned p-methoxybenzaldehyde, p-ethoxybenzaldehyde, p-propoxybenzaldehyde, p-butoxybenzaldehyde, p-pentoxybenzaldehyde, p-methylbenzaldehyde, p-ethylbenzaldehyde, p-propylbenzaldehyde, p-butylbenzaldehyde, p-pentylbenzaldehyde, m-methoxybenz-aldehyde, m-ethoxybenzaldehyde, m-propoxybenzaldehyde, m-butoxybenzaldehyde, m-pentoxybenzaldehyde, m-methylbenzaldehyde, m-ethylbenzaldehyde, m-propylbenzaldehyde, m-butylbenzaldehyde, m-pentylbenzaldehyde, m- and p-dimethoxybenzaldehyde, m- and p-diethoxybenzaldehyde, m- and p-dipropoxybenzaldehyde, m- and p-dibutoxybenzaldehyde, m- and p-dipentoxybenzaldehyde, m- and p-dimethylbenzaldehyde, m- and p-diethylbenzaldehyde, m- and p-dipropylbenzaldehyde, m- and p-dibutylbenzaldehyde, m- and p-dipentoxybenzaldehyde, 2-thiophene aldehyde, 3-methyl-2-thiophene aldehyde, 5-bromo-2-thiophene aldehyde, 2-furylaldehyde and 3-(2-furyl)acrolein.

As a preferred example of halomethyl-s-triazine, there may be mentioned halomethyl-s-triazines having the following structures.

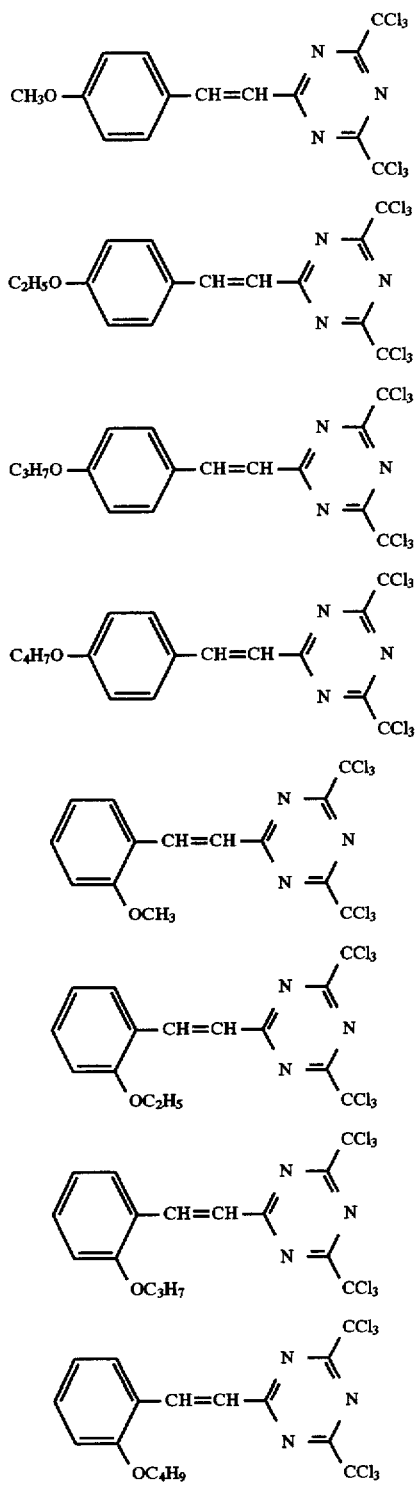

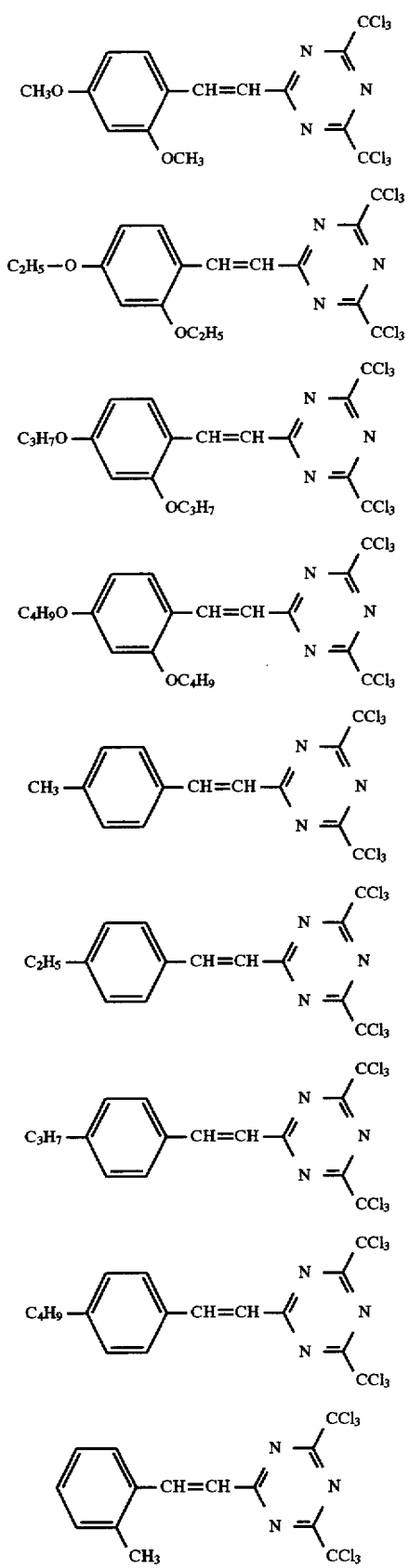
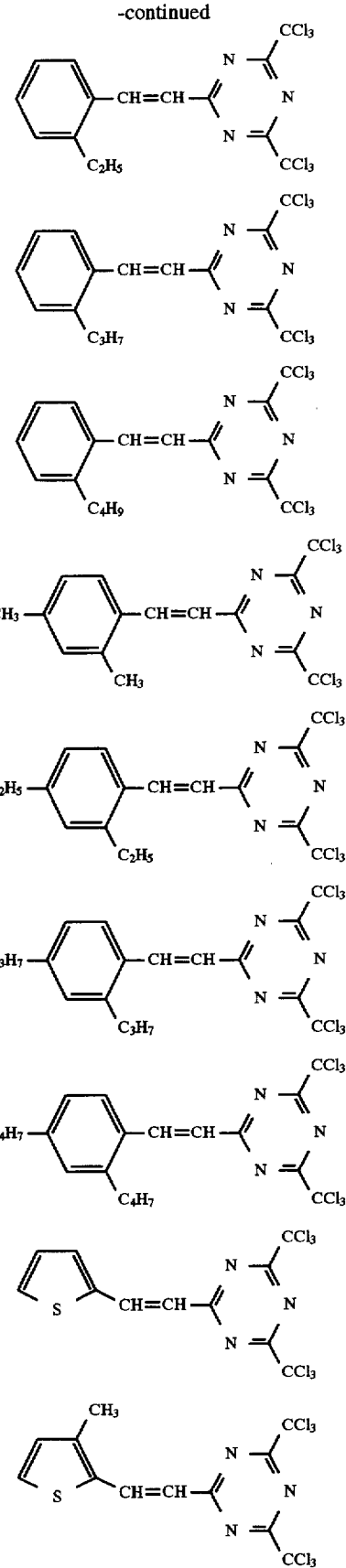

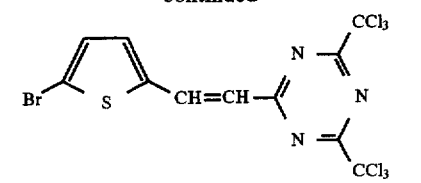
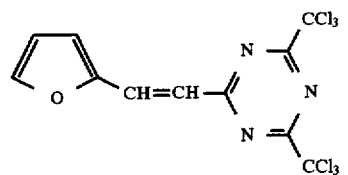
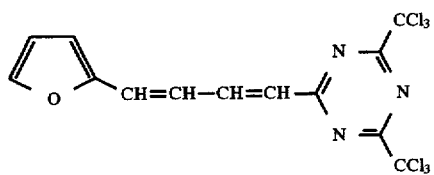
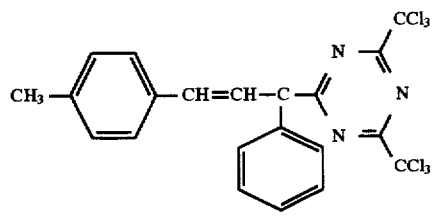
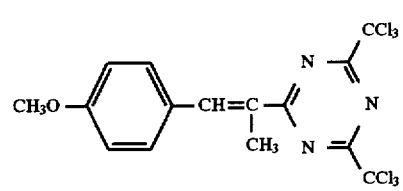
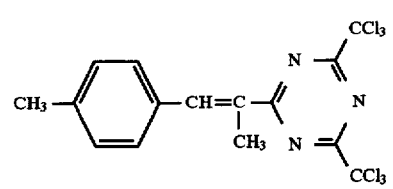
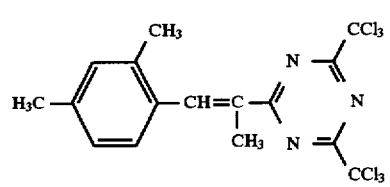
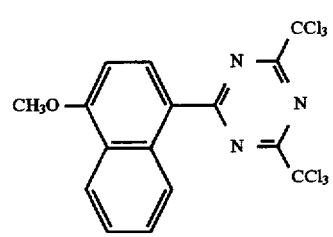
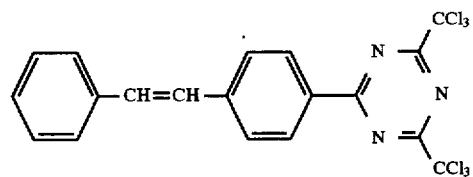
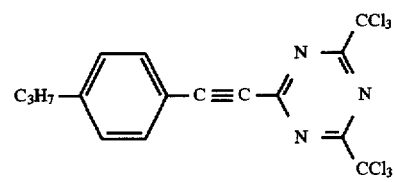
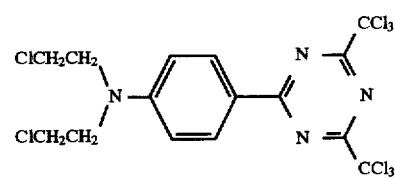
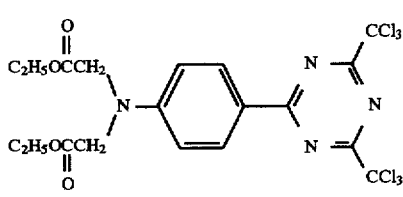
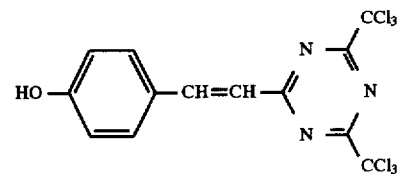
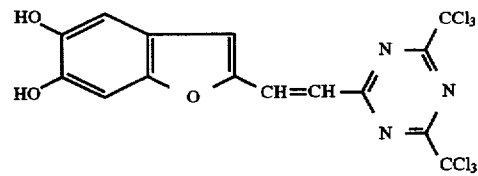
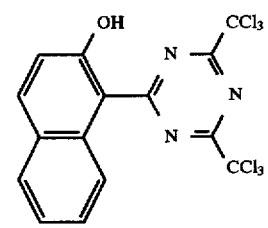
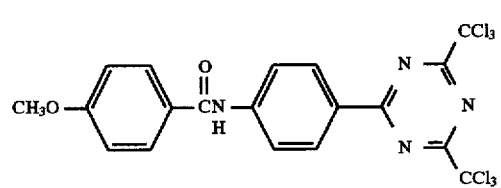

-continued

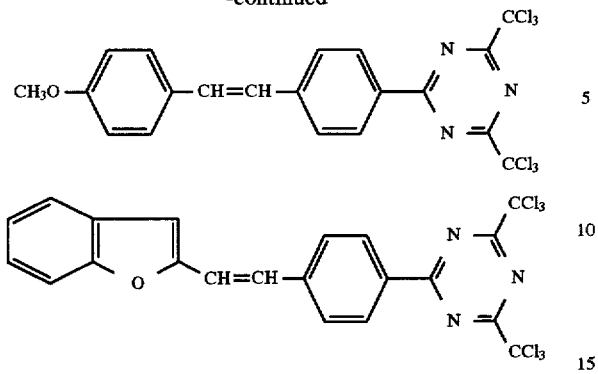

As the organic dye, there may be mentioned, for example, Victoria Pure Blue BOH (trade name, produced by Hodogaya Kagaku K. K.), Patent Pure Blue (trade name, produced by Sumitomo Mikuni Kagaku K. K.), Oil Blue #603 (trade name, produced by Orient Kagaku Kogyo K. K.), Sudan Blue II (trade name, produced by BASF), Crystal Violet, Malachite Green, Fuchsin, Methyl Violet, Ethyl Violet, Methyl Orange, Brilliant Green, Congo Red, Eosin and Rhodamine 66.

To the light-sensitive composition layer of the present invention, in addition to the materials described above, a plasticizer, a surfactant, an organic acid and an acid anhydride may be added, if necessary.

Further, to the light-sensitive composition of the present invention, an enclosure compound may be added.

The enclosure compound which can be used in the present invention is not particularly limited so long as it is a host compound which can take or enclose a chemical species such as a sodium ion and a potassium ion therein as a guest molecule, but it is preferably an organic compound which can be solved in a solvent used for preparing the composition. As an example of such an organic compound, there may be mentioned, for example, compounds described in Michio Hiraoka et al., "Host Guest Chemistry", published by Kodansha, Tokyo; Collet et al., "Tetrahedron Report", No. 226, p. 5725A (1987); Shinkai et al., "Chemistry and Chemical Industry" for April, p. 278 (1991); and Hiraoka et al., "Chemistry and Chemical Industry" for April, p. 288 (1991).

As the enclosure compound which can be preferably used in the present invention, there may be mentioned, for example, cyclic D-glucans, cyclophans, neutral polyligands, cyclic polyanions, cyclic polycations, cyclic peptides, spherands, cavitands and non-cyclic analogues thereof. Among them, cyclic D-glucans and non-cyclic analogues thereof, cyclophans and neutral polyligands are more preferred As the cyclic D-glucans and non-cyclic analogues thereof, there may be mentioned, for example, a compound in which α-D-glucopyranoses are linked by a glycoxide bonding.

As such a compound, there may be mentioned glucides constituted by a D-glucopyranose group such as starch, amylose and amylopectin; cyclodextrins such as α-cyclodextrin, β-cyclodextrin, γ-cyclodextrin and cyclodextrin in which a D-glucopyranose group-polymerization degree is 9 or more; and modified D-glucans in which a substituent such as a $SO_3C_6H_4CH_2C_6H_4SO_3$ group, a $NHCH_2CH_2NH$ group, a $NHCH_2CH_2NHCH_2CH_2NH$ group, a $SC_6H_5$ group, a $N_3$ group, a $NH_2$ group, a $NEt_2$ group, a $SC(NH^{+2})NH_2$ group, a SH group, a $SCH_2CH_2NH_2$ group, an imidazole group and an ethylenediamine group, represented by the following formulae:

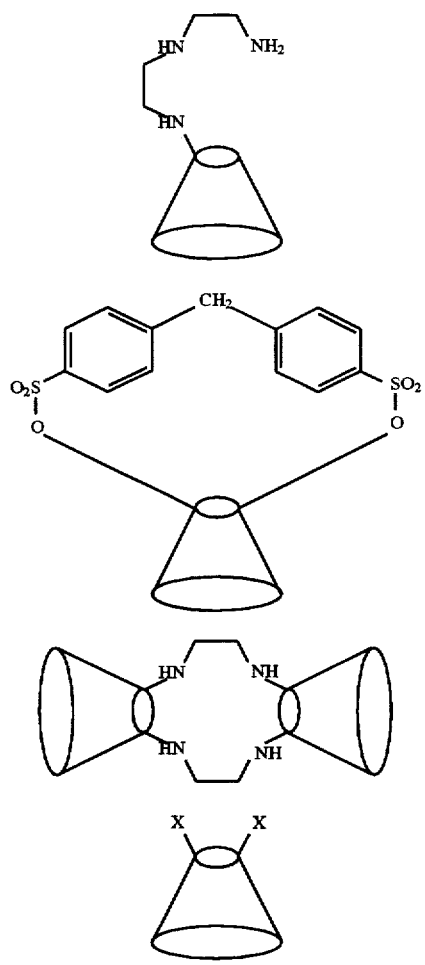

wherein X represents $C_6H_5$, $N_3$, $NH_2$, $N(C_2H_5)_2$, $SC(NH_2^+)NH_2$, SH, $SCH_2CH_2NH_2$ or

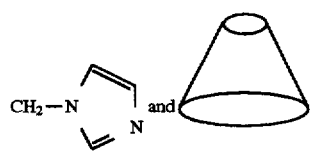

and represents cyclodextrin.

Also, there may be mentioned cyclodextrin derivatives represented by the following formulae (IX) and (X), a branched cyclodextrin and a cyclodextrin polymer.

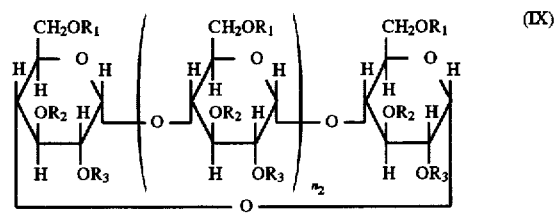

In the formula (IX), $R_1$ to $R_3$ may be the same or different from each other and each represent a hydrogen atom, an alkyl group or a substituted alkyl group. Each of $R_1$ to $R_3$ is particularly preferably a hydrogen atom, a hydroxyethyl group or a hydroxypropyl group, further preferably one containing a substituted alkyl group in one molecule of 15% to 50%. $n_2$ represents a positive integer of 4 to 10.

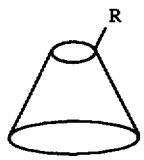
(X)

In the formula (X), R represents a hydrogen atom, —$R^2$—$CO_2H$, —$R^2SO_3H$, —$R^2NH_2$ or —N—$(R^3)_2$ (where $R^2$ represents a straight or branched alkylene group having 1 to 5 carbon atoms and $R^3$ represents a straight or branched alkyl group having 1 to 5 carbon atoms).

Cyclodextrin can be prepared by the method as described in, for example, "Journal of the American Chemical Society", Vol. 71, p. 354, 1949 or "Cheimish Berichte", Vol. 90, p. 2561, 1957 and Vol. 90, p. 2572, 1957, but the method is not limited thereto.

The branched cyclodextrin to be used in the present invention is a branched cyclodextrin obtained by adding or bonding, as a branched group, a water-soluble substance such as a monosaccharide and a disaccharide including glucose, maltose, cellobiose, lactose, sucrose, galactose and glucosamine to a known cyclodextrin, preferably maltosyl-cyclodextrin in which maltose is bonded to cyclodextrin (the number of bonding molecules of maltose is not limited and may be 1, 2 or 3) or glucosylcyclodextrin in which glucose is bonded to cyclodextrin (the number of bonding molecules of glucose is not limited and may be 1, 2 or 3).

Specific synthetic methods of these branched cyclodextrins are described in, for example, "Starch Chemistry", Vol. 33, No. 2, pp. 119 to 126 (1986), Ditto, pp. 127 to 132 (1986) and "Starch Chemistry", Vol. 30, No. 2, pp. 231 to 239 (1983). The branched cyclodextrins can be synthesized by referring to these known methods and, for example, malto-sylcyclodextrin can be prepared by a method in which cyclodextrin and maltose are used as starting materials and maltose is bonded to cyclodextrin by using an enzyme such as isoamylase and pullulanase. Glucosylcyclodextrin can be also prepared by the same method.

As a branched cyclodextrin which is preferably used in the present invention, there may be mentioned the following specific exemplary compounds.

EXEMPLARY COMPOUNDS

D-1 α-cyclodextrin to which one molecule of maltose is bonded

D-2 β-cyclodextrin to which one molecule of maltose is bonded

D-3 γ-cyclodextrin to which one molecule of maltose is bonded

D-4 α-cyclodextrin to which two molecules of maltose are bonded

D-5 β-cyclodextrin to which two molecules of maltose are bonded

D-6 γ-cyclodextrin to which two molecules of maltose are bonded

D-7 α-cyclodextrin to which three molecules of maltose are bonded

D-8 β-cyclodextrin to which three molecules of maltose are bonded

D-9 γ-cyclodextrin to which three molecules of maltose are bonded

D-10 α-cyclodextrin to which one molecule of glucose is bonded

D-11 β-cyclodextrin to which one molecule of glucose is bonded

D-12 β-cyclodextrin to which one molecule of glucose is bonded

D-13 α-cyclodextrin to which two molecules of glucose are bonded

D-14 β-cyclodextrin to which two molecules of glucose are bonded

D-15 γ-cyclodextrin to which two molecules of glucose are bonded

D-16 α-cyclodextrin to which three molecules of glucose are bonded

D-17 β-cyclodextrin to which three molecules of glucose are bonded

D-18 γ-cyclodextrin to which three molecules of glucose are bonded

Structures of these branched cyclodextrins have been investigated variously by measurement methods such as HPLC (high performance liquid chromatography), NMR (nuclear magnetic resonance), TLC (thin layer chromatography) and INEPT (insensitive nuclei enhanced by polarization transfer) methods. However, the structures have not yet been clarified and can be only estimated. The fact that each monosaccharide or disaccharide is bonded to cyclodextrin has been clarified by the above measurement methods. Therefore, in the present invention, when molecules of the monosaccharide or disaccharide are bonded to cyclodextrin, included are both of the case where the molecules are bonded to glucoses of cyclodextrin, respectively and the case where the molecules are bonded to one glucose straightly as shown below.

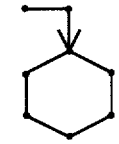

(bonded straightly)

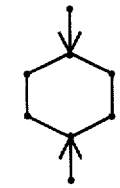

(bonded separately)

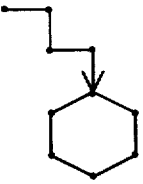

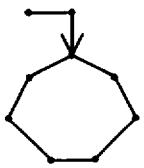

-continued

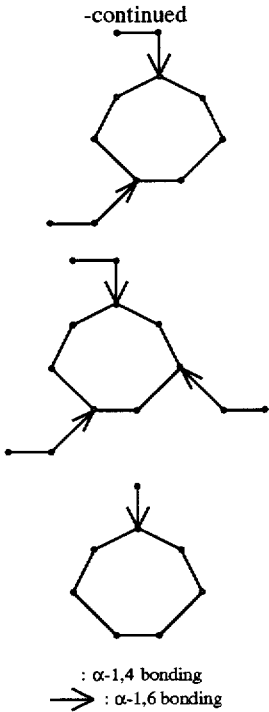

: α-1,4 bonding
⟶ : α-1,6 bonding

In these branched cyclodextrins, their existing cyclic structures are maintained as such so that they have characteristics that the same enclosure action as that of the existing cyclodextrins is exhibited, and highly water-soluble maltose or glucose is added so that solubility in water is improved significantly.

The branched cyclodextrin to be used in the present invention can be obtained as a commercially available product. For example, maltosylcyclodextrin is commercially available as Isoelite (trade name) produced by Ensuiko Seito Co.

Next, the cyclodextrin polymer to be used in the present invention is described.

As the cyclodextrin polymer to be used in the present invention, a cyclodextrin polymer represented by the following formula (XI) is preferred.

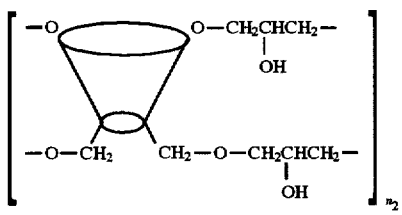

(XI)

wherein $n_2$ represents a polymerization degree of 3 to 4.

The cyclodextrin polymer to be used in the present invention can be prepared by crosslinking and polymerizing cyclodextrin using, for example, epichlorohydrin.

The above cyclodextrin polymers preferably have water-solubility, i.e., solubility in water of 20 g or more per 100 ml of water at 25° C. In order to obtain the water-solubility in the above range, a polymerization degree $n_2$ in the above formula (XI) is preferably made 3 or 4. As the polymerization degree is smaller, effects of making a cyclodextrin polymer itself water-soluble and making the above compounds soluble are high.

These cyclodextrin polymers can be synthesized by a common method described in, for example, Japanese Provisional Patent Publication No. 97025/1986 and German Patent No. 35 44 842.

The cyclodextrin polymers may be used as an enclosure compound of the cyclodextrin polymer as described above.

The cyclophans are cyclic compounds each having a structure that aromatic rings are linked by various bonds and many compounds have been known. As the cyclophans, there may be mentioned these known compounds.

As the bonds which link aromatic rings, there may be mentioned, for example, a single bond, a —$(CR_1R_2)_m$— bond, a —$O(CR_1R_2)_mO$— bond, a —$NH(CR_1R_2)_mNH$— bond, a —$(CR_1R_2)_pNR_3(CR_4R_5)_q$— bond, a —$(CR_1R_2)_pN^+R_3R_4$ $(CR_5R_6)_q$— bond, a —$(CR_1R_2)_pS^+R_3(CR_4R_5)_q$— bond, a —$CO_2$— bond and a —$CONR$— bond (where $R_1$, $R_2$, $R_3$, $R_4$, $R_5$ and $R_6$ may be the same or different and each represent a hydrogen atom or an alkyl group having 1 to 3 carbon atoms, and m, p and q may be the same or different and each represent an integer of 1 to 4).

As the above compounds, there may be mentioned, for example, paracyclophans represented by the following formulae:

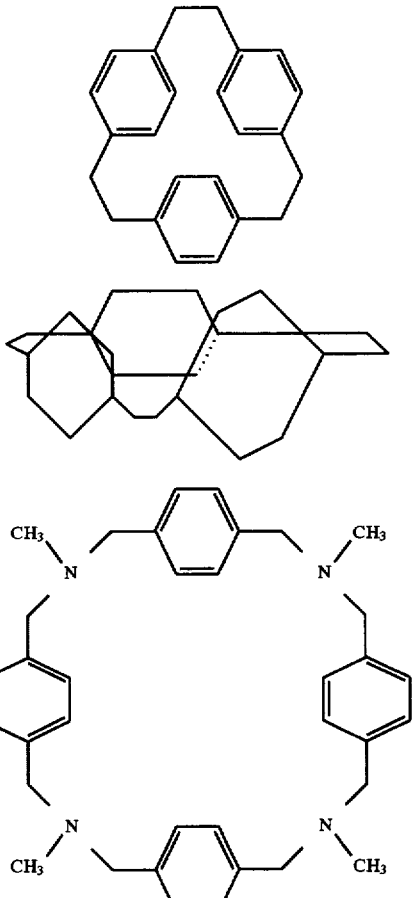

wherein

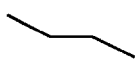

represents —$CH_2CH_2$—, orthocyclophans represented by tri-o-thymotide and cyclotoriveratrilen, represented by the following formulae:
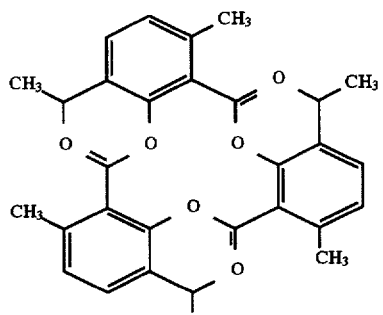
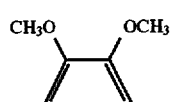
metacyclophans represented by metacyclophan, callix allene and a resorcinol-aldehyde cyclic oligomer, represented by the following formulae:
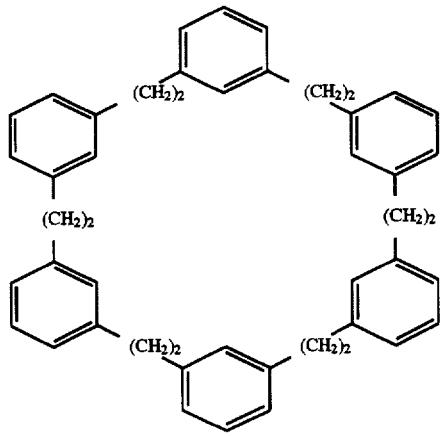
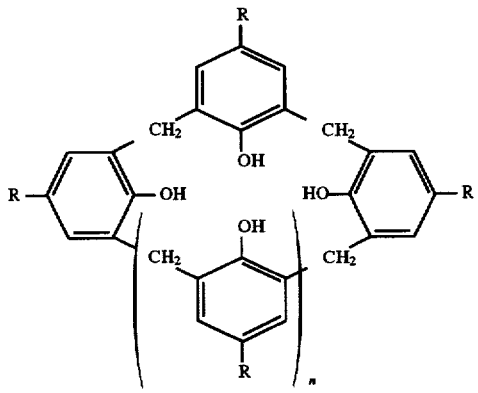
wherein R represents $CH_2C_8H_5$.
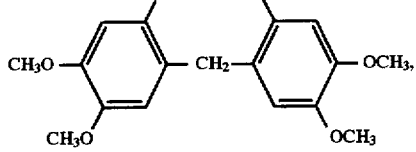
wherein R represents C, $CH_3$, t—$C_4H_9$, $C_6H_5$, $CO_2C_2H_5$ or i—$C_3H_7$, and n represents 4, 5, 6, 7 or 8.
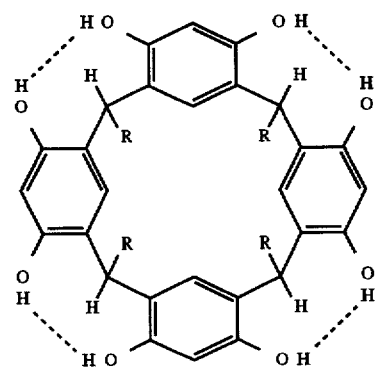

wherein R represents $CH_3$ or $C_6H_5$, and a p-substituted phenol non-cyclic oligomer represented by the following formula:

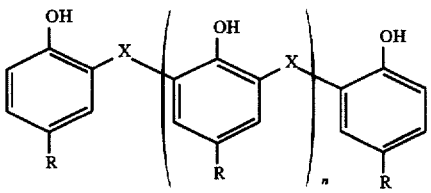

wherein X represents $CH_2$, —S— or a single bond, R represents $CH_3$ or t—$C_4H_9$ and n represents an integer of 1 to 10.

As the neutral polyligand, there may be mentioned a crown compound, a criptand, a cyclic polyamine and non-cyclic analogues thereof. It has been known that the neutral polyligand takes a metallic ion therein effectively, but it can also take a cationic organic molecule therein effectively.

As the other enclosure compounds, there may be mentioned urea, thiourea, deoxycholic acid, dinitrodiphenyl, hydroquinone, o-trithymotide, oxyflavan, dicyanoamminenickel, dioxytriphenylmethane, triphenylmethane, methylnaphthalene, spirochroman, perhydrotriphenylene, a clay mineral, graphite, a zeolite (e.g., faujasite, chabazite, mordenite, levynite, montmorillonite and halosite), cellulose, amylose and protein.

These enclosure compounds may be added singly or may be added together with a polymer in which a substituent having enclosure property is suspended as a pendant substituent for the purpose of improving solubility in a solvent and compatibility with other additives of the enclosure compound itself or the enclosure compound in which a molecule is taken in.

The above polymer can be obtained easily by using a method disclosed in, for example, Japanese Provisional Patent Publications No. 221501/1991, No. 221502/1991, No. 221503/1991, No. 221504/1991 and No. 221505/1991.

Among the above enclosure compounds, cyclic and non-cyclic D-glucans, cyclophans and non-cyclic cyclophan analogues are preferred. More specifically, cyclodextrin, callix allene, a resorcinol-aldehyde cyclic oligomer and a p-substituted phenol non-cyclic oligomer are preferred.

As the most preferred enclosure compound, there may be mentioned cyclodextrins and derivatives thereof. Among them, β-cyclodextrin and a derivative thereof are more preferred.

To the light-sensitive composition layer of the present invention, for example, a p-tert-butylphenolformaldehyde resin, a p-n-octylphenolformaldehyde resin or a resin in which the above resin is partially esterified with an o-quinonediazide compound may be further added in order to improve ink receptivity of the light-sensitive composition.

The light-sensitive composition layer of the present invention can be formed by dissolving or dispersing a light-sensitive composition comprising these respective components in a solvent and coating the resulting coating solution on a support, followed by drying.

As the solvent which can be used for dissolving the light-sensitive composition, there may be mentioned, for example, methyl cellosolve, methyl cellosolve acetate, ethyl cellosolve, ethyl cellosolve acetate, diethylene glycol monomethyl ether, diethylene glycol monoethyl ether, diethylene glycol dimethyl ether, diethylene glycol methyl ethyl ether, diethylene glycol diethyl ether, diethylene glycol monoisopropyl ether, propylene glycol, propylene glycol monoethyl ether acetate, propylene glycol monobutyl ether, propylene glycol monomethyl ether, propylene glycol monoethyl ether, dipropylene glycol monomethyl ether, dipropylene glycol dimethyl ether, dipropylene glycol methyl ethyl ether, propylene glycol monomethyl ether acetate, 3-methoxy-1-butanol, ethyl formate, propyl formate, butyl formate, amyl formate, methyl acetate, ethyl acetate, propyl acetate, butyl acetate, methyl propionate, ethyl propionate, methyl butyrate, ethyl butyrate, methyl lactate, ethyl lactate, dimethylformamide, dimethylsulfoxide, dioxane, acetone, methyl ethyl ketone, cyclohexanone, methylcyclohexanone, diacetone alcohol, acetylacetone, γ-butyrolactone, diethyl ketone and 4-hydroxy-2-butanone. Among them, as a particularly preferred solvent, there may be mentioned diethylene glycol diethyl ether, propylene glycol monomethyl ether, methyl lactate and methyl ethyl ketone. These solvents may be used singly or in combination of two or more.

As a coating method used for coating the light-sensitive composition on the surface of a support, there may be used a conventionally known method, for example, rotational coating, wire bar coating, dip coating, air knife coating, spray coating, air spray coating, static air spray coating, roll coating, blade coating and curtain coating. The amount to be coated varies depending on the use, but may be preferably, for example, 0.05 to 5.0 g/m$^2$ as a solid component.

Next, the support to be used for preparing the light-sensitive lithographic printing plate of the present invention is described.

The support is preferably a support which is flexible enough to be set in a conventional printing machine and can stand load applied during printing, and there may be used, for example, a plate of a metal such as aluminum, magnesium, zinc, chromium, iron, copper and nickel, a plate of an alloy of these metals and a metal plate coated thereon with chromium, zinc, copper, nickel, aluminum or iron by plating or vapor deposition. Among them, aluminum or an alloy thereof is preferred as the support.

Various aluminum alloys may be used and there may be mentioned, as the aluminum alloys, an alloy of aluminum and a metal such as silicon, copper, manganese, magnesium, chromium, zinc, lead, bismuth and nickel.

The support formed of aluminum, an alloy thereof or the like is generally subjected to degreasing treatment before graining treatment in order to remove oil components such as rolling oil attached on the surface of the support. As the degreasing treatment, there may be used degreasing treatment using a solvent such, as Tri-Clene (trade name, produced by Toagosei Chemical Industry Co., Ltd.) and a thinner and emulsion degreasing treatment using an emulsion such as kerosine and triethanol. In the degreasing treatment, an aqueous solution of an alkali such as sodium hydroxide may be used. When the aqueous solution of an alkali such as sodium hydroxide is used in the degreasing treatment, it is possible to remove stain and an oxidized film which cannot be removed only by the above degreasing treatment.

The graining treatment of the present invention can be carried out by using a known method such as the so-called mechanical toughening method in which a surface is roughened mechanically, the so-called chemical roughening method in which a surface is selectively dissolved chemically and the so-called electrochemical roughening method in which a surface is roughened electrochemically.

The mechanical roughening method includes, for example, methods such as ball grinding, brush grinding, blast grinding and buff grinding. The electrochemical roughening method includes, for example, a method of electrolysis treatment in an electrolyte containing hydrochloric acid or nitric acid by alternating current or direct current.

The graining treatment of the present invention can be carried out by using either one of the above methods or a combination of two or more of them.

On the Surface of the support obtained by the graining treatment, smut is generated. In order to remove the smut, it is generally preferred to carry out suitable treatment such as washing or alkaline etching. As such a treatment, there may be mentioned, for example, the alkaline etching method described in Japanese Patent Publication No. 28123/1973 and the sulfuric acid desmutting method described in Japanese Provisional Patent Publication No. 12739/1978.

The support treated as described above is then subjected to anodization treatment. By the anodization treatment, abrasion resistance, chemical resistance and water retention can be improved. The anodization treatment can be carried out by using a known method and, for example, a method in which electrolysis is effected at a current density of 1 to 10 A/dm$^2$ by using an aqueous solution containing 10 to 50% of sulfuric acid and/or phosphoric acid as an electrolyte is preferably used. Also, there may be used a method in which electrolysis is effected in sulfuric acid at a high current density described in U.S. Pat. No. 1,412,768 and a method in which electrolysis is effected by using phosphoric acid described in U.S. Pat. No. 3,511,661.

The support subjected to the anodization treatment may be subjected to pore-sealing treatment, if necessary. The pore-sealing treatment can be carried out by a known method such as hot water treatment, boiled water treatment, water vapor treatment, treatment using sodium silicate, treatment using a dichromate aqueous solution, treatment using nitrite and treatment using ammonium acetate.

It is preferred to further provide a hydrophilic layer on the support. For forming the hydrophilic layer, a water-soluble polymer, an alkali metal silicate described in U.S. Pat. No. 3,181,461, amino acid and a salt thereof described in Japanese Provisional Patent Publications No. 149491/1985 and No. 165183/1988, an amine having a hydroxyl group and a salt thereof described in Japanese Provisional Patent Publication No. 232998/1985, phosphate described in Japanese Provisional Patent Publication No. 19494/1987 and a high molecular weight compound having a monomer unit having a sulfo group described in Japanese Provisional Patent Publication No. 101651/1984 may be used.

As the water-soluble polymer for forming the hydrophilic layer, a compound having an organic phosphonic acid group is particularly preferred and there may be specifically mentioned an aromatic, heterocyclic, aliphatic or alicyclic phosphonic acid and a derivative thereof. Either a low molecular weight phosphonic acid compound and a derivative thereof or a high molecular weight phosphonic acid compound and a derivative thereof may be used. As the above compound having an organic phosphonic acid group, there may be mentioned, for example, vinylphosphonic acid, polyvinylphosphonic acid, 2-phosphonoethane-1-sulfonic acid, 3,3-diphosphono-pimelic acid, monomethyl vinylphosphonate, 4-chlorophenylphosphonic acid, 4-chloro-3-nitro-phenylphosphonic acid and a water-soluble copolymer of vinylphosphonic acid and acrylic acid and/or vinyl acetate. Among them, polyvinylphosphonic acid is particularly excellent.

Also, it is preferred to use the following compounds for forming the hydrophilic layer.

(1) Other water-soluble polymer

As a specific example, there may be mentioned a vinyl type resin and a derivative thereof such as PVA (polyvinyl alcohol), a modified PVA, polyvinyl pyrrolidone and polyvinyl imidazoline; an acrylic acid type copolymer such as polyacrylic acid, polyacrylamide and polyhydroxyethyl acrylate; polyethyleneimine; a maleic acid copolymer; polyethylene glycol; polypropylene glycol; a polyurethane resin; polyhydroxymethyl urea; a polyhydroxymethyl melamine resin; soluble starch; CMC (carboxymethyl cellulose); hydroxyethyl cellulose; guar gum; tragacanth gum; xanthane gum; sodium alginate; and gelatin.

(2) Compound having at least one amino group and two or more groups selected from the group consisting of a phosphonic acid group

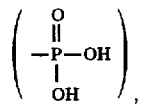

a phosphinic acid group

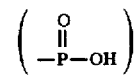

and a phosphoric acid group

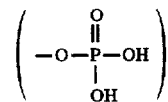

or a salt thereof

As the compound having a phosphonic acid group or a salt thereof, there may be mentioned, for example, 1-aminoethane-1,1-diphosphonic acid, 1-amino-1-phenylmethane-1,1-diphosphonic acid, 1-dimethylaminoethane-1,1-diphosphonic acid, 1-dimethylaminobutane-1,1-diphosphonic acid, 1-dimethylaminomethane-1,1-diphosphonic acid, 1-propylaminoethane-1,1-diphosphonic acid, 1-butylaminomethane-1,1-diphosphonic acid, aminotrimethylenephosphonic acid, ethylenediaminopentamethylenephosphonic acid, ethylenediaminotetramethylenephosphonic acid, diethylenetriaminopentamethylenephosphonic acid and aminotri(2-propylene-2-phosphonic acid), and hydrochlorides, formates and oxalates of these compounds. As the compound having a phosphinic acid group or a salt thereof, there may be mentioned compounds obtained by replacing a phosphonic acid group of the above compounds having a phosphonic acid group with a phosphinic acid group and salts thereof, for example, aminotrimethylenephosphinic acid. As the compound having a phosphoric acid or a salt thereof, there may be mentioned compounds obtained by replacing a phosphonic acid group of the above compounds having a phosphonic acid group with a phosphoric acid group and salts thereof, for example, aminotrimethylenephosphoric acid.

(3) Compound having at least one amino group and either a carboxyl group or a sulfone group, or a salt thereof As a specific example, there may be mentioned an amino acid such as aminoacetic acid, lysine, threonine, serine, aspartic acid, p-hydroxyphenylglycine, dihydroxyethylglycine, anthranilic acid, tryptophane and alginine; an aliphatic aminosulfonic acid such as sulfamic acid and cyclohexylsulfamic acid; and hydrochlorides, formates and oxalates of these compounds.

(4) Compound having at least one amino group and at least one hydroxyl group or a salt thereof As a specific example, there may be mentioned monoethanolamine, diethanolamine, trimethanolamine, tripropanolamine and triethanolamine, and hydrochlorides, formates and oxalates of these compounds.

(5) Alkane having at least two amino groups or a salt thereof

The alkane includes straight, branched and cyclic alkanes.

Particularly preferred is $NH_2\text{-}(CH_2)_n\text{-}NH_2$ (where n represents an integer of 2 to 10).

As a specific example, there may be mentioned ethylenediamine, 1,3-diaminopropane, 1,4-diaminobutane, 1,2-diaminopropane, 1,2-diamino-2-methylpropane, 1,5-diaminopentane, 1,6-diaminohexane, 1,7-diaminoheptane, 1,2-diaminocyclohexane, 1,8-diaminooctane, 1,9-diaminononane and 1,10-diaminodecane, and hydrochlorides, formates and oxalates of these compounds.

The light-sensitive lithographic printing plate of the present invention can be processed by carrying out exposure and development according to a conventional method. For example, a transparent original picture having a line image or a dot image is closely contacted to a light-sensitive surface and subjected to exposure, and then a light-sensitive layer at a non-image portion is removed by using a suitable developing solution to obtain a relief image.

As a suitable light source for exposure, there may be used a mercury lamp, a metal halide lamp, a xenon lamp, a chemical lamp and a carbon arc lamp. As the developing solution and developing replenishing solution to be used for development, an alkaline aqueous solution is preferred. For example, an alkaline aqueous solution such as an aqueous solution of an alkali metal silicate (e.g., sodium silicate and potassium silicate), sodium hydroxide, potassium hydroxide, sodium tertiary phosphate, sodium secondary phosphate, sodium carbonate or potassium carbonate may be used.

In the present invention, it is preferred that both of the developing solution and the developing replenishing solution to be used for developing the light-sensitive lithographic printing plate contain an alkali metal silicate.

An alkali metal of the alkali metal silicate is lithium, sodium or potassium and among them, potassium is most preferred.

When development is carried out, it is preferred to replenish a developing replenishing solution suitably depending on the development processing amount of the light-sensitive lithographic printing plate.

Preferred developing solution and developing replenishing solution are an aqueous solution of an alkali metal silicate having $[SiO_2]/[M]$ (where $[SiO_2]$ represents a molar concentration of $SiO_2$ and [M] represents a molar concentration of an alkali metal) of 0.15 to 1.0 and a $SiO_2$ concentration of 0.5 to 5.0% by weight based on the total weight of the solution. It is particularly preferred that the developing solution has $[SiO_2]/[M]$ of 0.25 to 0.75 and a $SiO_2$ concentration of 1.0 to 4.0% by weight, and the developing replenishing solution has $[SiO_2]/[M]$ of 0.15 to 0.5 and a $SiO_2$ concentration of 1.0 to 3.0% by weight.

The pH of the developing solution or the developing replenishing solution is preferably 12 to 13.8.

In the above developing solution and developing replenishing solution, a water-soluble or alkali-soluble organic or inorganic reducing agent may be contained.

As the organic reducing agent, there may be mentioned, for example, a phenol compound such as hydroquinone, metol and methoxyquinone, and an amine compound such as phenylenediamine and phenylhydrazine. As the inorganic reducing agent, there may be mentioned, for example, a sulfite such as sodium sulfite, potassium sulfite, ammonium sulfite, sodium hydrogen sulfite and potassium hydrogen sulfite; a phosphite such as sodium phosphite, potassium phosphite, sodium hydrogen phosphite, potassium hydrogen phosphite, disodium hydrogen phosphite and dipotassium hydrogen phosphite; hydrazine, sodium thiosulfate and sodium dithionite.

In the developing solution and the developing replenishing solution, 0.05 to 10% by weight of the water-soluble or alkali-soluble reducing agent may be contained.

In the developing solution and the developing replenishing solution, an organic carboxylic acid may be also contained.

The organic carboxylic acid includes an aliphatic carboxylic acid having 6 to 20 carbon atoms and an aromatic carboxylic acid in which a carboxyl group is substituted on a benzene ring or a naphthalene ring.

As the aliphatic carboxylic acid, an alkanoic acid having 6 to 20 carbon atoms is preferred. As a specific example, there may be mentioned caproic acid, enanthylic acid, caprylic acid, pelargonic acid, capric acid, lauric acid, myristic acid, palmitic acid and stearic acid, particularly preferably an alkanoic acid having 6 to 12 carbon atoms. The aliphatic carboxylic acid may be either an aliphatic acid having a double bond in a carbon chain or an aliphatic acid having a branched carbon chain. The above aliphatic carboxylic acid may be used in the form of a sodium or potassium salt or an ammonium salt.

As a specific compound of the aromatic carboxylic acid, there may be mentioned benzoic acid, o-chlorobenzoic acid, p-chlorobenzoic acid, o-hydroxybenzoic acid, p-hydroxybenzoic acid, p-tert-butylbenzoic acid, o-aminobenzoic acid, p-aminobenzoic acid, 2,4-dihydroxybenzoic acid, 2,5-dihydroxybenzoic acid, 2,6-dihydroxybenzoic acid, 2,3-dihydroxybenzoic acid, 3,5-dihydroxybenzoic acid, gallic acid, 1-hydroxy-2-naphthoic acid, 3-hydroxy-2-naphthoic acid, 2-hydroxy-1-naphthoic acid, 1-naphthoic acid and 2-naphthoic acid.

The above aromatic carboxylic acid may be used in the form of a sodium or potassium salt or an ammonium salt.

The aliphatic carboxylic acid or the aromatic carboxylic acid may be contained in an amount of at least 0.1 to 30% by weight.

In the developing solution and the developing replenishing solution, the respective anionic, nonionic and cationic surfactant and organic solvent described below may be contained.

As the anionic surfactant, there may be mentioned a salt of a higher alcohol ($C_6$ to $C_{22}$) sulfate (e.g., a sodium salt of lauryl alcohol sulfate, a sodium salt of octyl alcohol sulfate, an ammonium salt of lauryl alcohol sulfate, "Teepol-81" (trade name produced by Shell Chemical Co.) and disodium alkyl sulfate), a salt of aliphatic alcohol phosphate (e.g., a sodium salt of cetyl alcohol phosphate), a salt of alkylarylsulfonic acid (e.g., a sodium salt of dodecylbenzenesulfonic acid, a sodium salt of isopropylnaphthalenesulfonic acid, a sodium salt of dinaphthalenedisulfonic acid and a sodium salt of metanitrobenzenesulfonic acid), a sulfonate of alkylamide $C_{17}H_{33}CON(CH_3)CH_2SO_3Na$) and a sulfonate or sulfosuccinate of a dibasic aliphatic acid ester (e.g., dioctyl sodium sulfosuccinate and dihexyl sodium sulfosuccinate). Among them, a sulfonate is particularly suitably used.

As the nonionic surfactant, either a polyethylene glycol type surfactant or a polyvalent alcohol type surfactant may be used.

As the nonionic surfactant, there may be mentioned, for example, compounds represented by the following formulae (1) to (8).

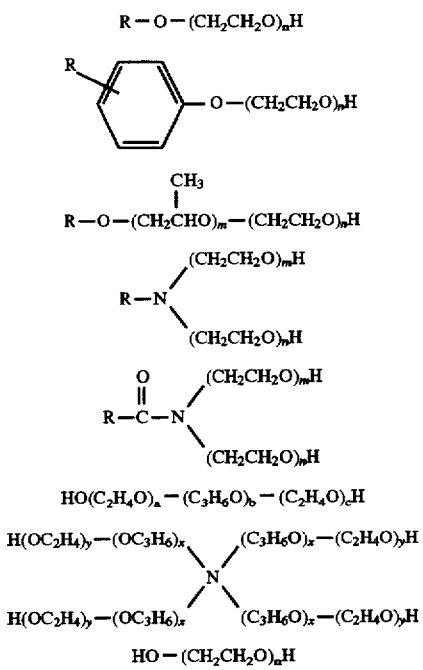

In the formulae (1) to (8), R represents a hydrogen atom or a monovalent organic group, and a, b, c, m, n, x and y each represent an integer of 1 to 40.

As the organic group represented by R, there may be mentioned, for example, a straight or branched alkyl group having 1 to 30 carbon atoms, an alkyl group having a substituent (e.g., an aryl group such as phenyl), an alkylcarbonyl group in which an alkyl portion is a straight or branched alkyl group having 1 to 30 carbon atoms, and a phenyl group which may have a substituent(s) (e.g., a hydroxyl group and the above alkyl group).

Specific examples of the nonionic surfactant are shown below:

polyethylene glycol, polyoxyethylene lauryl ether, polyoxyethylene nonyl ether, polyoxyethylene cetyl ether, polyoxyethylene stearyl ether, polyoxyethylene oleyl ether, polyoxyethylene behenyl ether, polyoxyethylene polyoxypropylene cetyl ether, polyoxyethylene polyoxypropylene behenyl ether, polyoxyethylene nonylphenyl ether, polyoxyethylene octylphenyl ether, polyoxyethylene stearylamine, polyoxyethylene oleylamine, polyoxyethylene stearic acid amide, polyoxyethylene oleic acid amide, polyoxyethylene castor oil, polyoxyethylene abietyl ether, polyoxyethylene lanolin ether, polyoxyethylene monolaurate, polyoxyethylene monostearate, polyoxyethylene glyceryl monooleate, polyoxyethylene glyceryl monostearate, polyoxyethylene propylene glycol monostearate, an oxyethylene oxypropylene block polymer, a distyrenated phenol polyethylene oxide adduct, a tribenzylphenol polyethylene oxide adduct, an octylphenol polyethylene polyoxypropylene adduct, glycerol monostearate, sorbitan monolaurate and polyoxyethylene sorbitan monolaurate.

The weight average molecular weight of the nonionic surfactant is preferably in the range of 300 to 10,000. The concentration of the nonionic surfactant in the developing solution may be 0.001 to 10% by weight.

The cationic surfactant is roughly classified into an amine type surfactant and a quaternary ammonium salt type surfactant, and both of them may be used.

As an example of the amine type surfactant, there may be mentioned polyoxyethylenealkylamine, N-alkylpropyleneamine, N-alkylpolyethylenepolyamine, N-alkylpolyethylenepolyaminedimethylsulfate, alkylbiguanide, long-chain amine oxide, alkylimidazoline, 1-hydroxyethyl-2-alkylimidazoline, 1-acetylaminoethyl-2-alkylimidazoline and 2-alkyl-4-methyl-4-hydroxymethyloxazoline.

As an example of the quaternary ammonium salt type surfactant, there may be mentioned a long-chain primary amine salt, an alkyl trimethylammonium salt, a dialkyl dimethylethylammonium salt, an alkyl dimethylammonium salt, an alkyl dimethylbenzylammonium salt, an alkyl pyridinium salt, an alkyl quinolinium salt, an alkyl isoquinolinium salt, alkyl pyridinium sulfate, a stearamide methylpyridinium salt, an acylaminoethyldiethylamine salt, an acylaminoethylmethyldiethylammonium salt, an alkylamidopropyldimethylbenzylammonium salt, aliphatic acid polyethylene polyamide, an acylaminoethylpyridinium salt, an acylcolaminoformylmethylpyridinium salt, a stearoxymethylpyridinium salt, aliphatic acid triethanolamine, aliphatic acid triethanolamine formate, trioxyethylene aliphatic acid triethanolamine, aliphatic acid dibutylaminoethanol, a cetyloxymethylpyridinium salt and a p-isooctylphenoxyethoxyethyldimethylbenzylammonium salt ("alkyl" in the above exemplary compounds represents a straight or partially substituted alkyl having 6 to 20 carbon atoms, preferably a straight alkyl such as hexyl, octyl, cetyl and stearyl).

Further, as the cationic surfactant, a polymer having a cationic component as a recurring unit, for example, a polymer containing a quaternary ammonium salt obtained by copolymerization with a lipophilic monomer may be contained.

The amount of the Cationic surfactant to be added to the developing solution may be in the range of 0.001 to 10% by weight.

The cationic surfactant having a weight average molecular weight of 300 to 50,000 may be used.

As the surfactant, it is preferred to use a fluorine type surfactant having a perfluoroalkyl group in a molecule. As such a fluorine type surfactant, there may be mentioned an anionic surfactant such as perfluoroalkylcarboxylate, perfluoroalkylsulfonate and perfluoroalkylphosphate; an amphoteric surfactant such as perfluoroalkylbetaine; a cationic surfactant such as a perfluoroalkyltrimethylammonium salt; and a nonionic surfactant such as perfluoroalkylamine oxide, a perfluoroalkylethylene oxide adduct, an oligomer having a perfluoroalkyl group and a hydrophilic group, an oligomer having a perfluoroalkyl group and a lipophilic group, an oligomer having a perfluoroalkyl group, a hydrophilic group and a lipophilic group and urethane having a perfluoroalkyl group and a lipophilic group.

The above surfactants may be used singly or in combination of two or more.

In the developing solution and the developing replenishing solution, an organic solvent may be contained.

As the organic solvent, an organic solvent having a solubility in water at 20° C. of 10% by weight or less is preferred and there may be mentioned, for example, a carboxylate such as ethyl acetate, propyl acetate, butyl acetate, benzyl acetate, ethylene glycol monobutyl acetate, butyl lactate and butyl levulinate; a ketone such as ethyl butyl ketone, methyl isobutyl ketone and cyclohexanone; an alcohol such as ethylene glycol monobutyl ether, ethylene glycol benzyl ether, ethylene glycol monophenyl ether, benzyl alcohol, methylphenyl carbinol, n-amyl alcohol and methylamyl alcohol; an alkyl-substituted aromatic hydrocarbon such as xylene; and a halogenated hydrocarbon such as methylene dichloride, ethylene dichloride and monochlorobenzene.

These organic solvents may be used singly or in combination of two or more.

To the developing solution and the developing replenishing solution, the following additives may be added for the purpose of heightening developability. As the additives, there may be mentioned, for example, a neutral salt such as NaCl, KCl and KBr described in Japanese Provisional Patent Publication No. 75152/1983, a chelating agent such as EDTA (ethylenediaminetetraacetic acid) and NTA (nitrilotriacetic acid) described in Japanese Provisional Patent Publication No. 190952/1984, a complex such as [Co(NH$_3$)]$_6$Cl$_3$ described in Japanese Provisional Patent Publication No. 121336/1984, an amphoteric polymeric electrolyte such as a copolymer of vinylbenzyltrimethylammonium chloride and sodium acrylate described in Japanese Provisional Patent Publication No. 142528/1981, an inorganic lithium compound such as lithium chloride described in Japanese Provisional Patent Publication No. 59444/1983, an organic lithium compound such as lithium benzoate described in Japanese Patent Publication No. 34442/1975, an organometallic surfactant containing Si or Ti described in Japanese Provisional Patent Publication No. 75255/1984 and an organic boron compound described in Japanese Provisional Patent Publication No. 84241/1984.

EXAMPLES

The present invention is described in detail by referring to Examples, but the present invention is not limited thereby.

Example 1

(Preparation of Support A)

An aluminum plate (material: 1050, tempering: H16) having a thickness of 0.3 mm was degreased in a 5% sodium hydroxide aqueous solution maintained at 65° C. for 1 minute, washed, dipped in a 10% sulfuric acid aqueous solution maintained at 25° C. for 1 minute to neutralize and further washed. The aluminum plate was electrolytically roughened in a 1.0% by weight hydrochloric acid aqueous solution under conditions of a temperature of 25° C., a current density of 100 A/dm$^2$ and a treatment time of 60 seconds by alternating current. Thereafter, the plate was desmutted in a 5% sodium hydroxide aqueous solution at 60° C. for 10 seconds and then anodized in a 20% sulfuric acid solution under conditions of a temperature of 20° C., a current density of 3 A/dm$^2$ and a treatment time of 1 minute. Thereafter, the plate was dipped in a 1% sodium nitrite aqueous solution maintained at 80° C. for 30 seconds, washed and then dried at 80° C. for 3 minutes. Further, the plate was dipped in a PVPA (polyvinylphosphonic acid) aqueous solution (concentration: 0.1% by weight) maintained at 85° C. for 30 seconds and then dried at 80° C. for 5 minutes to prepare Support A.

(Preparation of Support B)

Support B was prepared in the same manner as in Support A described above except for changing PVPA (polyvinylphosphonic acid) to carboxymethyl cellulose.

(Preparation of Light-Sensitive Lithographic Printing Plate Samples)

According to the combinations in Table 1 shown below, the following Coating solution A to Coating solution H were coated on Support A or B by using a wire bar, respectively, and dried at 80° C. for 1 minute to prepare Light-sensitive lithographic printing plate samples 1 to 8.

| (Coating solution A) | |
|---|---|
| (1) Novolak resin (molar ratio of phenol/m-cresol/ p-cresol: 5/57/38, weight average molecular weight: 4,000) | 4.5 g |
| (2) Condensate of pyrogallol acetone resin (weight average molecular weight: 3,000) and o-naphthoquinonediazide-5-sulfonyl chloride (esterification ratio: 30%) | 1.5 g |
| (3) Polyethylene glycol #2000 (trade name, produced by Daiichi Kogyo Seiyaku Co.) | 0.1 g |
| (4) Victoria Pure Blue BOH (trade name, produced by Hodogaya Kagaku K.K.) | 0.1 g |
| (5) 2,4-Bis(trichloromethyl)-6-(p-methoxystyryl)-s-triazine | 0.1 g |
| (6) FC-430 (trade name, produced by Sumitomo 3M K.K.) | 0.03 g |
| (7) Cis-1,2-cyclohexanedicarboxylic acid | 0.2 g |
| (8) High molecular weight compound 1 shown below | 0.5 g |
| (9) Methyl ethyl ketone/diethylcarbitol (50/50) | 100 ml |

High molecular weight compound 1

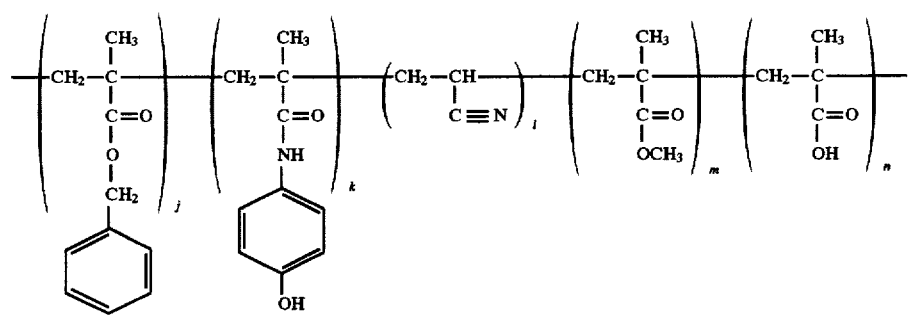

j/k/l/m/n = 5/30/20/36.5/8.5

| (Coating solution A') | |
|---|---|
| (1) Novolak resin (molar ratio of phenol/m-cresol/ p-cresol: 10/54/36, weight average molecular weight: 4,000) | 6.7 g |
| (2) Condensate of pyrogallol acetone resin (weight average molecular weight: 3,000) and o-naphthoquinonediazide-5-sulfonyl chloride (esterification ratio: 30%) | 1.5 g |
| (3) Polyethylene glycol #2000 (trade name, produced by Daiichi Kogyo Seiyaku Co.) | 0.2 g |
| (4) Victoria Pure Blue BOH (trade name, produced by Hodogaya Kagaku K.K.) | 0.08 g |
| (5) 2,4-Bis(trichloromethyl)-6-(p-methoxystyryl)-s-triazine | 0.15 g |

| (Coating solution B continued) | |
|---|---|
| (6) FC-430 (trade name, produced by Sumitomo 3M K.K.) | 0.03 g |
| (7) Cis-1,2-cyclohexanedicarboxylic acid | 0.2 g |
| (8) High molecular weight compound 1 (the same as in Coating solution A) | 0.2 g |
| (9) Methyl ethyl ketone/diethylcarbitol (50/50) | 100 ml |

| (Coating solution B) | |
|---|---|
| (1) Novolak resin (molar ratio of phenol/m-cresol/p-cresol: 5/57/38, weight average molecular weight: 4,000) | 4.5 g |
| (2) Condensate of pyrogallol acetone resin (weight average molecular weight: 3,000) and o-naphthoquinone-diazide-5-sulfonyl chloride (esterification ratio: 30%) | 1.5 g |
| (3) Polyethylene glycol #2000 (trade name, produced by Daiichi Kogyo Seiyaku Co.) | 0.1 g |
| (4) Victoria Pure Blue BOH (trade name, produced by Hodogaya Kagaku K.K.) | 0.1 g |
| (5) 2,4-Bis(trichloromethyl)-6-(p-methoxystyryl)-s-triazine | 0.1 g |
| (6) FC-430 (trade name, produced by Sumitomo 3M K.K.) | 0.03 g |
| (7) Cis-1,2-cyclohexanedicarboxylic acid | 0.2 g |
| (8) High molecular weight compound 2 shown below | 0.5 g |
| (9) Methyl ethyl ketone/diethylcarbitol (50/50) | 100 ml |

| (Coating solution C) | |
|---|---|
| (1) Novolak resin (molar ratio of phenol/m-cresol/p-cresol: 5/57/38, weight average molecular weight: 4,000) | 4.5 g |
| (2) Condensate of pyrogallol acetone resin (weight average molecular weight: 3,000) and o-naphthoquinone-diazide-5-sulfonyl chloride (esterification ratio: 30%) | 1.5 g |
| (3) Polyethylene glycol #2000 (trade name, produced by Daiichi Kogyo Seiyaku Co.) | 0.1 g |
| (4) Victoria Pure Blue BOH (trade name, produced by Hodogaya Kagaku K.K.) | 0.1 g |
| (5) 2,4-Bis(trichloromethyl)-6-(p-methoxystyryl)-s-triazine | 0.1 g |
| (6) FC-430 (trade name, produced by Sumitomo 3M K.K.) | 0.03 g |
| (7) Cis-1,2-cyclohexanedicarboxylic acid | 0.2 g |
| (8) High molecular weight compound 3 shown below | 0.5 g |
| (9) Methyl ethyl ketone/diethylcarbitol (50/50) | 100 ml |

High molecular weight compound 2

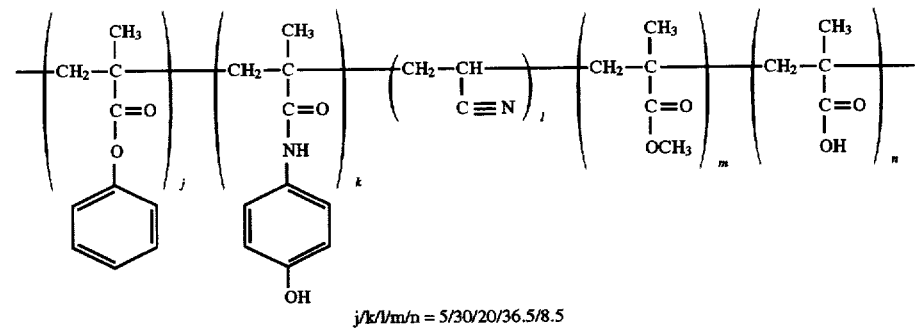

j/k/l/m/n = 5/30/20/36.5/8.5

High molecular weight compound 3

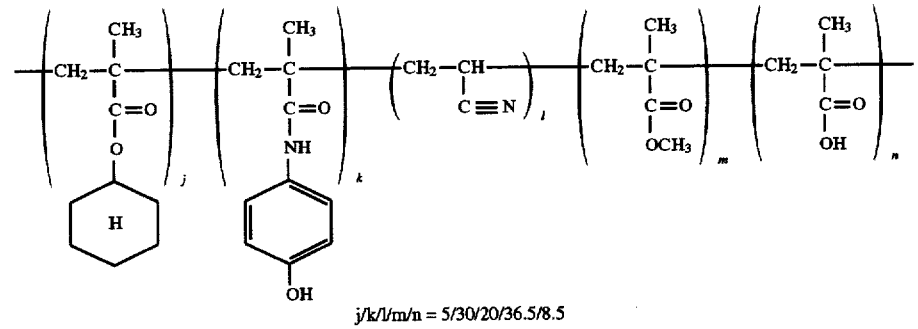

j/k/l/m/n = 5/30/20/36.5/8.5

| (Coating solution D) | |
|---|---|
| (1) Novolak resin (molar ratio of phenol/m-cresol/ p-cresol: 5/57/38, weight average molecular weight: 4,000) | 4.5 g |
| (2) Condensate of pyrogallol acetone resin (weight average molecular weight: 3,000) and o-naphthoquinone-diazide-5-sulfonyl chloride (esterification ratio: 30%) | 1.5 g |
| (3) Polyethylene glycol #2000 (trade name, produced by Daiichi Kogyo Seiyaku Co.) | 0.1 g |
| (4) Victoria Pure Blue BOH (trade name, produced by Hodogaya Kagaku K.K.) | 0.1 g |
| (5) 2,4-Bis(trichloromethyl)-6-(p-methoxystyryl)-s-triazine | 0.1 g |
| (6) FC-430 (trade name, produced by Sumitomo 3M K.K.) | 0.03 g |
| (7) Cis-1,2-cyclohexanedicarboxylic acid | 0.2 g |
| (8) Hydroxypropyl-β-cyclodextrin | 0.2 g |
| (9) High molecular weight compound 4 shown below | 0.5 g |
| (10) Methyl ethyl ketone/diethylcarbitol (50/50) | 100 ml |

| (Coating solution E) | |
|---|---|
| (1) Novolak resin (molar ratio of phenol/m-cresol/ p-cresol: 1/54/36, weight average molecular weight: 4,000) | 4.5 g |
| (2) Condensate of pyrogallol acetone resin (weight average molecular weight: 3,000) and o-naphthoquinone-diazide-5-sulfonyl chloride (esterification ratio: 30%) | 1.5 g |
| (3) Polyethylene glycol #2000 (trade name, produced by Daiichi Kogyo Seiyaku Co.) | 0.1 g |
| (4) Victoria Pure Blue BOH (trade name, produced by Hodogaya Kagaku K.K.) | 0.1 g |
| (5) 2,4-Bis(trichloromethyl)-6-(p-methoxystyryl)-s-triazine | 0.1 g |
| (6) FC-430 (trade name, produced by Sumitomo 3M K.K.) | 0.03 g |
| (7) Cis-1,2-cyclohexanedicarboxylic acid | 0.2 g |
| (8) Hydroxypropyl-β-cyclodextrin | 0.2 g |
| (9) High molecular weight compound 4 shown below | 0.5 g |
| (10) Methyl ethyl ketone/diethylcarbitol (50/50) | 100 ml |

| (Coating solution F) | |
|---|---|
| (1) Novolak resin (blend of a novolak resin having a molar ratio of phenol/m-cresol/p-cresol of 5/57/38 and a weight average molecular weight of 4,000 and a novolak resin having a molar ratio of phenol/m-cresol/ p-cresol of 20/48/32 and a weight average molecular weight of 8,000, blending ratio: 50/50)) | 4.5 g |
| (2) Condensate of pyrogallol acetone resin (weight average molecular weight: 3,000) and o-naphthoquinone-diazide-5-sulfonyl chloride (esterification ratio: 30%) | 1.5 g |
| (3) Polyethylene glycol #2000 (trade name, produced by Daiichi Kogyo Seiyaku Co.) | 0.1 g |
| (4) Victoria Pure Blue BOH (trade name, produced by Hodogaya Kagaku K.K.) | 0.1 g |
| (5) 2,4-Bis(trichloromethyl)-6-(p-methoxystyryl)-s-triazine | 0.1 g |
| (6) FC-430 (trade name, produced by Sumitomo 3M K.K.) | 0.03 g |
| (7) Cis-1,2-cyclohexanedicarboxylic acid | 0.2 g |
| (8) Hydroxypropyl-β-cyclodextrin | 0.2 g |
| (9) High molecular weight compound 4 shown below | 0.5 g |
| (10) Methyl ethyl ketone/propylene glycol monomethyl ether (30/70) | 100 ml |

| (Coating solution G) | |
|---|---|
| (1) Novolak resin (molar ratio of phenol/m-cresol/ p-cresol: 5/57/38, weight average molecular weight: 4,000) | 4.5 g |
| (2) Condensate of pyrogallol acetone resin (weight average molecular weight: 3,000) and o-naphthoquinone-diazide-5-sulfonyl chloride (esterification ratio: 30%) | 1.5 g |
| (3) Polyethylene glycol #2000 (trade name, produced by Daiichi Kogyo Seiyaku Co.) | 0.1 g |
| (4) Victoria Pure Blue BOH (trade name, produced by Hodogaya Kagaku K.K.) | 0.1 g |
| (5) FC-430 (trade name, produced by Sumitomo 3M K.K.) | 0.03 g |
| (6) Cis-1,2-cyclohexanedicarboxylic acid | 0.2 g |
| (7) Methyl cellosolve | 100 ml |

| (Coating solution H) | |
|---|---|
| (1) Novolak resin (molar ratio of phenol/m-cresol/ p-cresol: 5/57/38, weight average molecular weight: 4,000) | 4.5 g |
| (2) Condensate of trihydroxybenzophenone and o-naphthoquinonediazide-5-sulfonyl chloride | 1.5 g |
| (3) Polyethylene glycol #2000 (trade name, produced by Daiichi Kogyo Seiyaku Co.) | 0.1 g |
| (4) Victoria Pure Blue BOH (trade name, produced by Hodogaya Kagaku K.K.) | 0.1 g |
| (5) FC-430 (trade name, produced by Sumitomo 3M K.K.) | 0.03 g |
| (6) Cis-1,2-cyclohexanedicarboxylic acid | 0.2 g |
| (7) Methyl cellosolve | 100 ml |

For Light-sensitive lithographic printing plate samples 1 to 8 obtained, sensitivity, press life and stain due to a remaining film were evaluated according to the following evaluation methods. The results are shown in Table 1.
(Evaluation methods)
Sensitivity A step tablet No. 2 (trade name, produced by Eastman Kodak Co., each concentration difference of 0.15, gray scale of 21 grades) for measuring sensitivity was closely contacted with a sample, and the sample was exposed to light from a distance of 90 cm by using a 4 kW metal halide lamp Vio Quick (trade name, produced by Dainippon Screen K. K.) as a light source. Then, the sample was developed by using a developing solution obtained by diluting a developing solution SDR-1 (trade name, produced by Konica Corporation) 6 times with water, at 27° C. for 20 seconds. Sensitivity was determined by an exposure time until 3.0 grade of the above step tablet was completely clear.
Press life A step tablet No. 2 (trade name, produced by Eastman Kodak Co., each concentration difference of 0.15, gray scale of 21 grades) for measuring sensitivity was closely contacted with a sample, and the sample was exposed to light from a distance of 90 cm by using a 4 kW metal halide lamp Vio Quick (trade name, produced by Dainippon Screen K. K.) as a light source.

Then, the sample was developed by using a developing solution obtained by diluting a developing solution SDR-1

High molecular weight compound 4

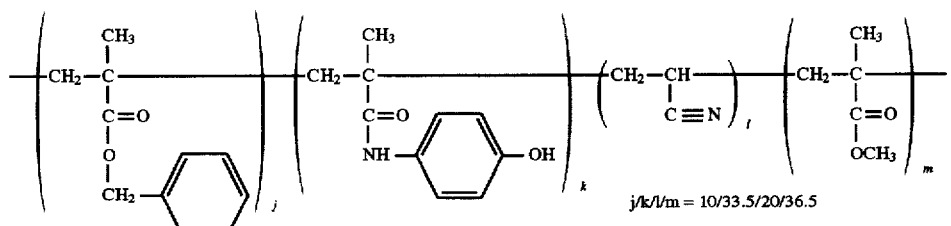

j/k/l/m = 10/33.5/20/36.5

(trade name, produced by Konica Corporation) 6 times with water, at 27° C. for 20 seconds.

The lithographic printing plate obtained was set in a printing machine Heidelberg GTO (trade name, produced by Heidelberger Druckmaschinen AG (Germany)), and printing was carried out by using a coated paper, a printing ink New Bright Magenta (trade name, produced by Toyo Ink Seizo K. K.) and a plate etch aqueous solution SEU-3 (2.5%, trade name, produced by Konica Corporation). The printing was continued until inking failure was caused at a solid image portion of a printed paper or a non-image portion was inked, and the number of printed papers until then was counted to determine press life.

Stain due to a remaining film

A light-sensitive lithographic printing plate sample was exposed to light from a distance of 90 cm by using a 4 kW metal halide lamp as a light source. Then, the exposed light-sensitive lithographic printing plate was developed by using a developing solution obtained by diluting a commercially available developing solution SDR-1 (trade name, produced by Konica Corporation) 6 times with water, at 27° C. for 20 seconds.

Under the above exposure and development conditions, five image portions (5 mm×15 mm) were formed on the lithographic printing plate, and the image portions were erased by an erasing solution SIR-15 (trade name, produced by Konica Corporation). Five kinds of erasing times were used, and stain at a fringe at each erasing time was confirmed by inking using a developing ink SPO-1 (trade name, produced by Konica Corporation) and evaluated according to the following evaluation standard.

Evaluation standard

O: A fringe is not stained.

Δ: An erasing mark is observed (a fringe is not inked, but a remaining film can be confirmed visually with naked eyes)

X: A fringe is stained (a fringe is inked)

TABLE 1

| | Coating solution | Support | Sensitivity (sec) | Press life (in ten thousands of sheets) | Stain due to remaining film | Remarks |
|---|---|---|---|---|---|---|
| Sample 1 | A | A | 25 | 40 | o | Present invention |
| Sample 1' | A' | A | 25 | 40 | o | Present invention |
| Sample 2 | B | A | 25 | 35 | o | Present invention |
| Sample 3 | C | A | 25 | 35 | o | Present invention |
| Sample 4 | D | A | 20 | 40 | o | Present invention |
| Sample 5 | E | A | 20 | 40 | o | Present invention |
| Sample 6 | F | A | 25 | 42 | o | Present invention |
| Sample 7 | G | B | 25 | 25 | Δ | Comparison |
| Sample 8 | H | B | 20 | 20 | Δ | Comparison |

The light-sensitive composition and the light-sensitive lithographic printing plate of the present invention can satisfy all of press life, high sensitivity, high developability and hydrophilic property.

We claim:

1. A light-sensitive composition containing an o-quinonediazide compound, a novolak resin and a polymer, characterized in that the polymer contains 3 to 40 mole % of a constitutional unit selected from the group consisting of constitutional units represented by the formulae (I), (II) and (III):

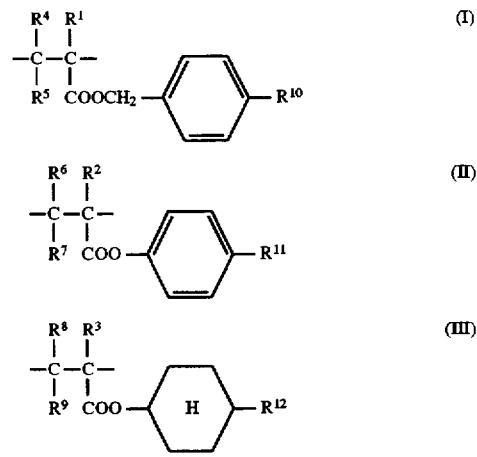

wherein $R^1$ to $R^{12}$ each represent a hydrogen atom, an alkyl group or a phenyl group;

and the composition further comprises an enclosure compound which acts as a host compound capable of taking a chemical species therein as a guest compound.

2. The composition of claim 1 wherein $R^1$ is a hydrogen atom or a lower alkyl group having 1 to 4 carbon atoms; each of $R^4$ and $R^5$ is a hydrogen atom, a lower alkyl group having 1 to 6 carbon atoms or a phenyl group; $R^{10}$ is a hydrogen atom, a lower alkyl group having 1 to 6 carbon atoms or a phenyl group; $R^2$ is a hydrogen atom or a lower alkyl group having 1 to 4 carbon atoms; each of $R^6$ and $R^7$ is a hydrogen atom, a lower alkyl group having 1 to 6 carbon atoms or a phenyl group; $R^{11}$ is a hydrogen atom, a lower alkyl group having 1 to 6 carbon atoms or a phenyl group; $R^3$ is a hydrogen atom or a lower alkyl group having 1 to 4 carbon atoms; each of $R^8$ and $R^9$ is a hydrogen atom, a lower alkyl group having 1 to 6 carbon atoms or a phenyl group; and $R^{12}$ is a hydrogen atom, a lower alkyl group having 1 to 6 carbon atoms or a phenyl group.

3. The composition of claim 1 wherein $R^1$ is a hydrogen atom or a methyl group; each of $R^4$ and $R^5$ is a hydrogen atom; R10 is a hydrogen atom; $R^2$ is a hydrogen atom or a methyl group, each of $R^6$ and $R^7$ is a hydrogen atom; $R^{11}$ is a hydrogen atom; $R^3$ is a hydrogen atom or a methyl group; each of $R^8$ and $R^9$ is a hydrogen atom; and $R^{12}$ is a hydrogen atom.

4. The composition of claim 1 wherein the polymer contains 5 to 20 mole % of at least one constitutional unit selected from the group consisting of the constitutional units represented by the formulae (I), (II) and (III).

5. The composition of claim 1 wherein the polymer contains a constitutional unit selected from the group consisting of (a) acrylates and methacrylates, (b) acrylic acid, methacrylic acid, maleic anhydride and itaconic acid, (c) acrylonitrile and methacrylonitrile, (d) vinyl monomers having an aromatic hydroxyl group, (e) acrylamides and methacrylamides, (f) styrene and substituted styrenes, (g) N-vinylpyrrolidone and N-vinylcarbazole, (h) vinylpyridine and (i) olefins.

6. The composition of claim 5 wherein the polymer contains 20 to 70 mole % of a constitutional unit selected from (a) acrylates and methacrylates, 0 to 30 mole % of a constitutional unit selected from (b) acrylic acid, methacrylic acid, maleic anhydride and itaconic acid, 10 to 40 mole % of a constitutional unit selected from (c) acrylonitrile and methacrylonitrile, and 5 to 50 mole % of a constitutional unit selected from (d) vinyl monomers having an aromatic hydroxyl group.

7. The composition of claim 1 wherein the novolak resin is a phenol.cresol.formaldehyde copolymer.

8. The composition of claim 1 wherein the o-quinonediazide compound is a polycondensed resin having an o-quinonediazide group of pyrogallol and an aldehyde or a ketone.

9. The composition of claim 1 wherein the enclosure compound is cyclodextrin or a cyclodextrin derivative.

10. The composition of claim 1 wherein said composition further comprises a halomethyl-s-triazine compound.

11. A light-sensitive layer coating solution which comprises the composition of claim 1 dissolved in a solvent containing at least one selected from the group consisting of propylene glycol monomethyl ether, methyl ethyl ketone, methyl lactate and diethylene glycol diethyl ether.

12. A light-sensitive lithographic printing plate which comprises a support and a light-sensitive layer comprising the composition of claim 1, provided on the support.

13. The plate of claim 12 wherein the support is a support obtained by subjecting a support to graining treatment and anodization treatment and then providing a hydrophilic layer comprising a compound having an organic phosphonic acid group on the support.

14. The plate of claim 12 wherein the light-sensitive layer is a light-sensitive layer formed by coating and drying the solution of claim 9.

15. The plate of claim 12 wherein the light-sensitive layer is formed by coating the solution of claim 9 on a support obtained by subjecting a support to graining treatment and anodization treatment and then providing a hydrophilic layer comprising a compound having an organic phosphonic acid group on the support; and then drying the solution.

* * * * *